US011372062B2

(12) United States Patent
Tomiha et al.

(10) Patent No.: US 11,372,062 B2
(45) Date of Patent: Jun. 28, 2022

(54) COIL ELEMENT, LOCAL COIL APPARATUS, AND MAGNETIC RESONANCE IMAGING APPARATUS

(71) Applicant: Canon Medical Systems Corporation, Otawara (JP)

(72) Inventors: Sadanori Tomiha, Nasushiobara (JP); Takafumi Ohishi, Yokohama (JP); Sho Kawajiri, Nasushiobara (JP); Satoshi Imai, Nasushiobara (JP)

(73) Assignee: Canon Medical Systems Corporation, Otawara (JP)

( * ) Notice: Subject to any disclaimer, the term of this patent is extended or adjusted under 35 U.S.C. 154(b) by 0 days.

(21) Appl. No.: 17/070,078

(22) Filed: Oct. 14, 2020

(65) Prior Publication Data

US 2021/0132165 A1    May 6, 2021

(30) Foreign Application Priority Data

Oct. 31, 2019 (JP) .............................. JP2019-198867

(51) Int. Cl.
*G01R 33/34* (2006.01)
(52) U.S. Cl.
CPC . *G01R 33/34084* (2013.01); *G01R 33/34007* (2013.01)
(58) Field of Classification Search
CPC .................... G01R 33/34084; G01R 33/34007
See application file for complete search history.

(56) References Cited

U.S. PATENT DOCUMENTS

| 4,617,936 A | 10/1986 | Malko |
| 4,960,106 A | 10/1990 | Kubokawa et al. |
| 5,435,302 A * | 7/1995 | Lenkinski .............. G01R 33/34 324/318 |
| 2007/0062933 A1* | 3/2007 | Weber ................... A61B 5/055 219/674 |
| 2007/0066883 A1* | 3/2007 | Kimmlingen ........... F28D 15/00 600/410 |
| 2019/0219648 A1* | 7/2019 | Lin .................. G01R 33/34084 |

FOREIGN PATENT DOCUMENTS

| JP | 62-34550 A | 2/1987 |
| JP | 62-59845 A | 3/1987 |
| JP | 6-28648 A | 2/1994 |

OTHER PUBLICATIONS

Port, A. et al., "Liquid metal in stretchable tubes: A wearable 4-channel knee array," Proc. Intl. Soc. Reson. Med 27, 2019, 7 pages.
Mehmann, A. et al., "Automatic Resonance Frequency Retuning of Stretchable Liquid Metal Receive Coil for Magnetic Resonance Imaging," IEEE Transactions on Medical Imaging, vol. 38, No. 6, Jun. 2019, 7 pages.

* cited by examiner

*Primary Examiner* — G. M. A Hyder
(74) *Attorney, Agent, or Firm* — Oblon, McClelland, Maier & Neustadt, L.L.P.

(57) ABSTRACT

According to one embodiment, a coil element includes an extendable and contractible coil and a capacitor. The capacitor is connected to the coil and has an electrostatic capacity which changes due to a physical change in response to extension or contraction of the coil.

21 Claims, 16 Drawing Sheets

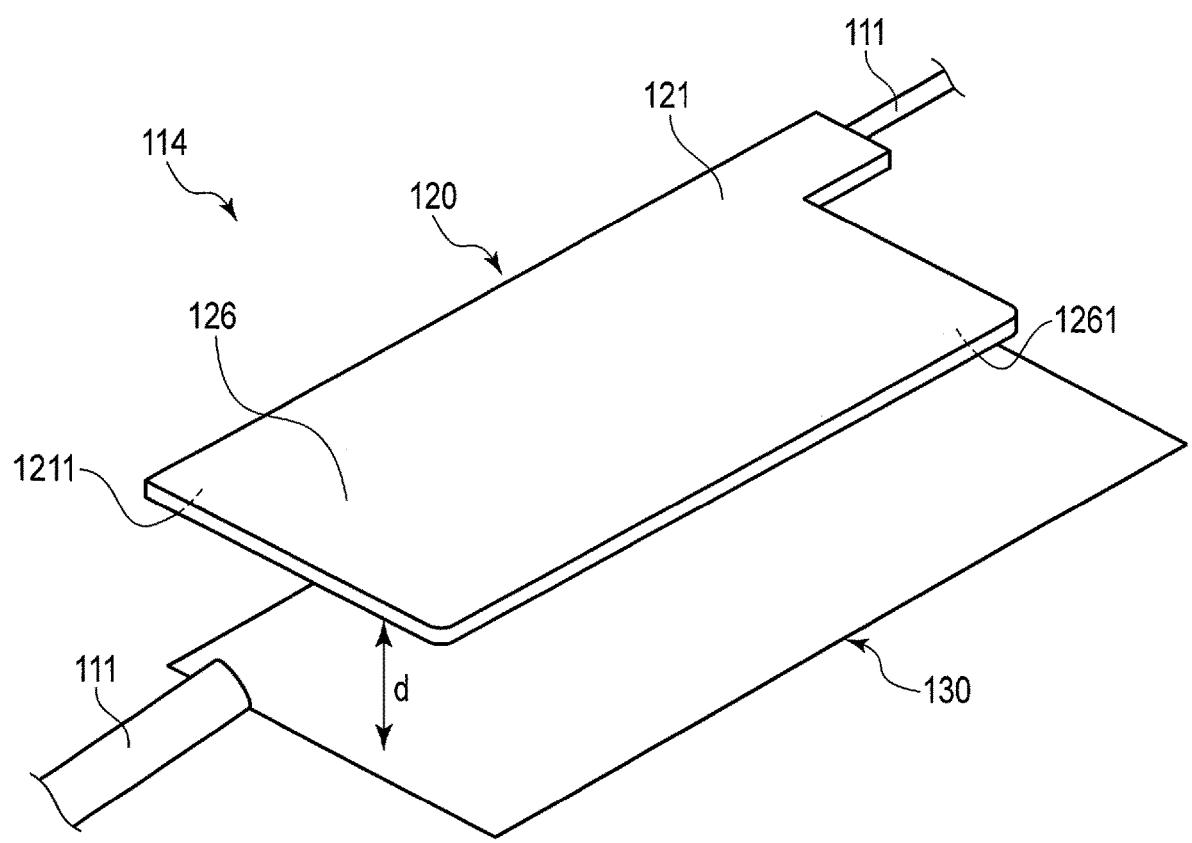
F I G. 8

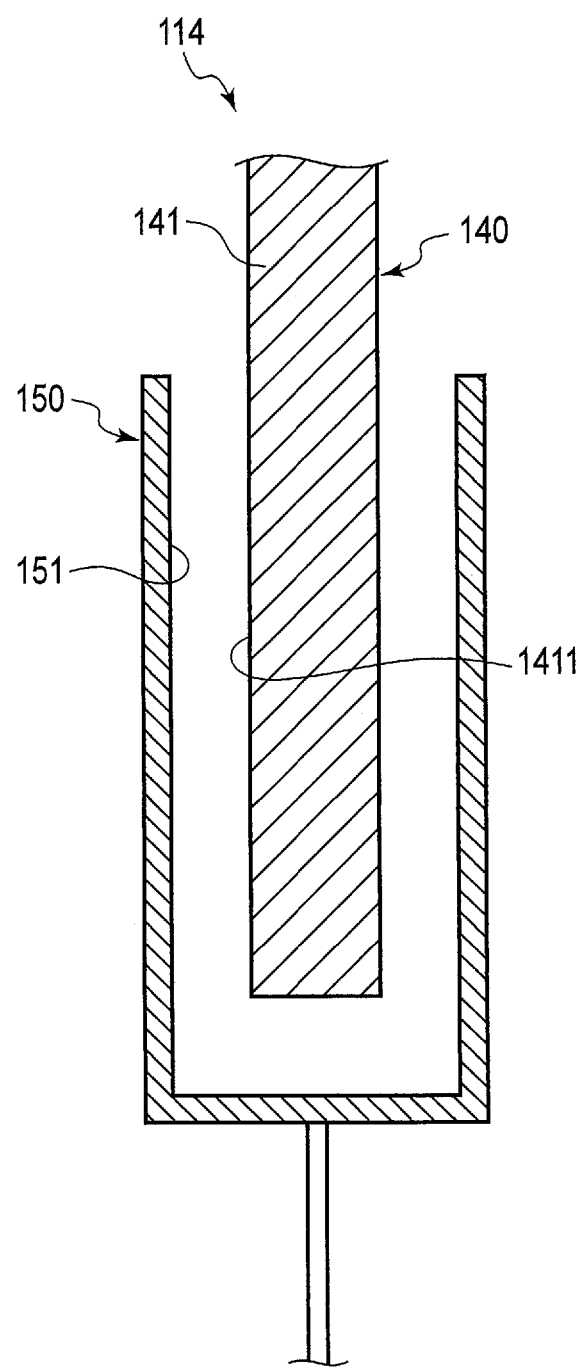
F I G. 12

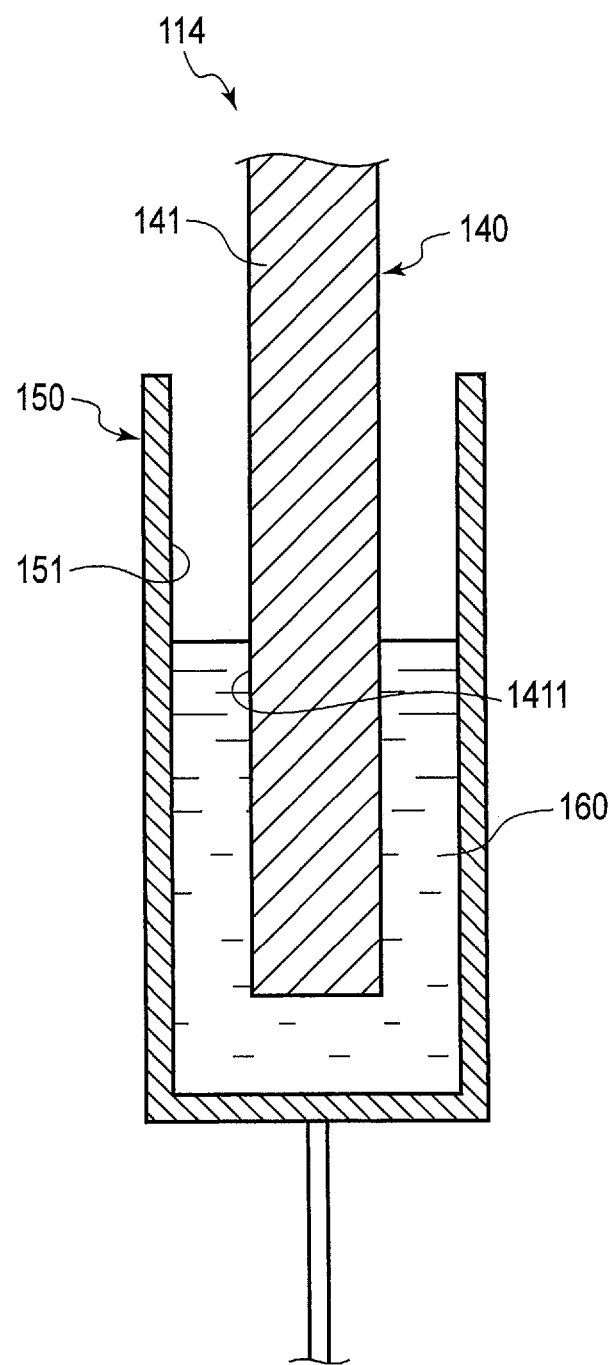
F I G. 14

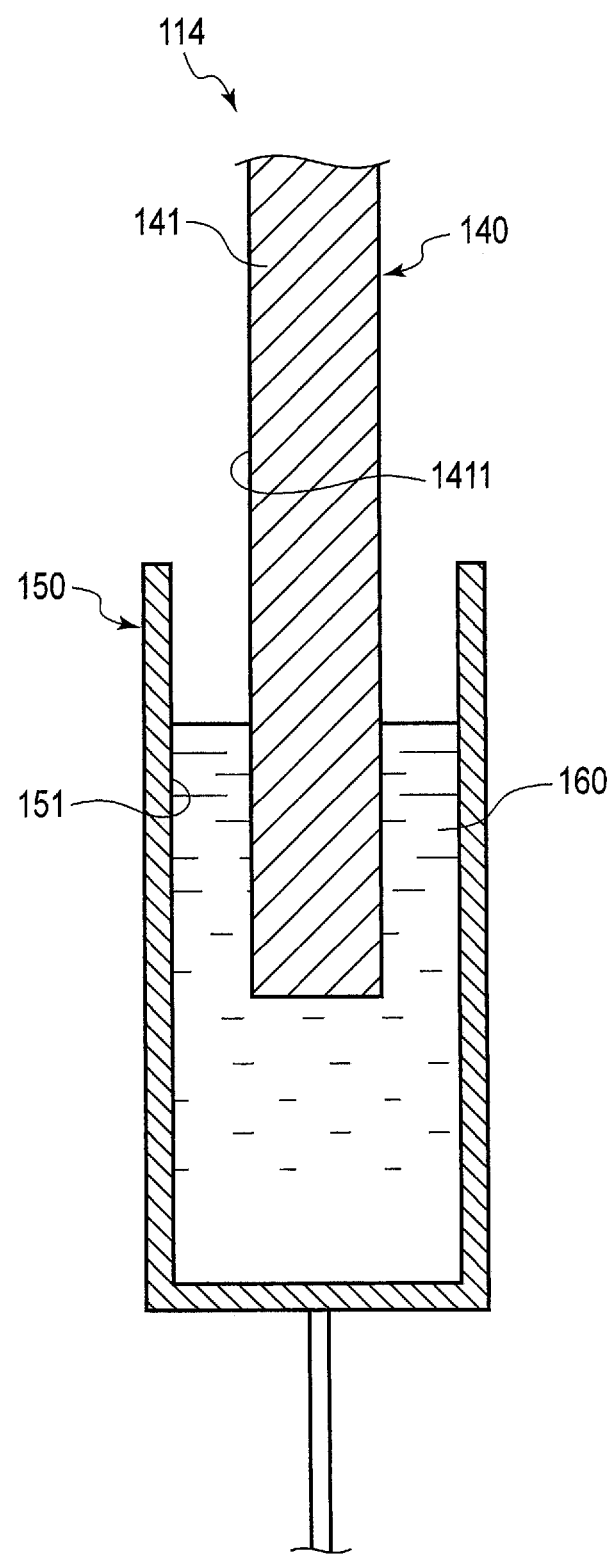
F I G. 15

COIL ELEMENT, LOCAL COIL APPARATUS, AND MAGNETIC RESONANCE IMAGING APPARATUS

CROSS-REFERENCE TO RELATED APPLICATIONS

This application is based upon and claims the benefit of priority from the Japanese Patent Application No. 2019-198867, filed Oct. 31, 2019 the entire contents of which are incorporated herein by reference.

FIELD

Embodiments described herein relate generally to a coil element, a local coil apparatus, and a magnetic resonance imaging apparatus.

BACKGROUND

Some magnetic resonance imaging apparatuses use, as a receiver coil to detect MR signals, a local coil apparatus that is used by being fitted on an imaging region of a subject. The local coil apparatus includes an extendable and contractible coil element. The coil element is constituted of an extendable and contractible hollow tube and a liquid metal filled into the tube. When the coil element extends or contracts in response to movement of an imaging region of the subject, an inductance changes with this extension or contraction of the coil element, thereby causing a variation in a resonance frequency of the receiver coil.

BRIEF DESCRIPTION OF THE DRAWINGS

FIG. 8 is a view showing an exemplary configuration of a capacitor according to a first modification of the first embodiment.

FIG. 12 is a view showing an exemplary configuration of a capacitor according to a first modification of the second embodiment.

FIG. 14 is a view showing an exemplary configuration of the capacitor according to the second modification of the second embodiment.

FIG. 15 is a view showing an exemplary configuration of a capacitor according to a second modification of the second embodiment.

DETAILED DESCRIPTION

In general, according to one embodiment, a coil element includes an extendable and contractible coil and a capacitor. The capacitor is connected to the coil and has an electrostatic capacity which changes due to a physical change in response to extension or contraction of the coil.

Hereinafter, embodiments of a coil element, a local coil apparatus including the coil element, and a magnetic resonance imaging (MRI) apparatus including the local coil apparatus will be described in detail with reference to the accompanying drawings. In the following description, structural elements having approximately the same function and configuration will be assigned the same reference symbol, and a repeat description will be given only where necessary. In the following description, a "magnetic resonance imaging apparatus" may be referred to as an "MRI apparatus".

First Embodiment

Figure 1:
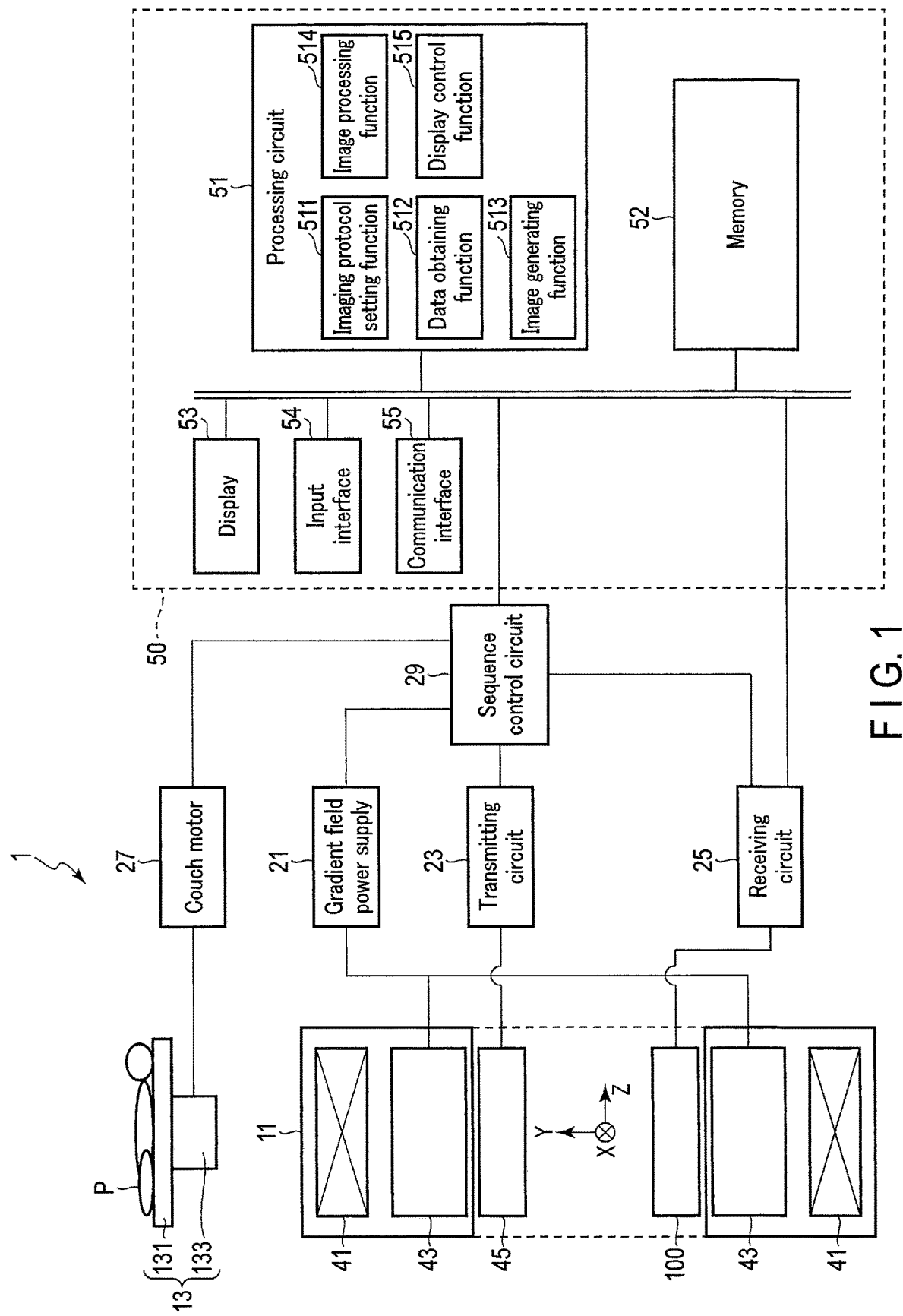
FIG. 1 is a view showing a configuration of a magnetic resonance imaging apparatus according to a first embodiment.

FIG. 1 is a view showing a configuration of a magnetic resonance imaging apparatus 1 according to the present embodiment. As shown in FIG. 1, the magnetic resonance imaging apparatus 1 includes a gantry 11, a couch 13, a gradient field power supply 21, a transmitting circuit 23, a receiving circuit 25, a couch motor 27, a sequence control circuit 29, and a host computer 50. The host computer is an example of the data processing apparatus.

The gantry 11 includes a static field magnet 41 and a gradient field coil 43. The static field magnet 41 and the gradient field coil 43 are accommodated in the housing of the gantry 11. The housing of the gantry 11 is formed with a bore having a hollow shape. A transmitter coil 45 and a local coil apparatus 100 are disposed in the bore of the gantry 11.

The static field magnet 41 has a hollow substantially cylindrical shape and generates a static magnetic field inside a substantially cylindrical interior. Examples of the static field magnet 41 include a permanent magnet, a superconducting magnet, and a normal conducting magnet. Here, a central axis of the static field magnet 41 is defined as a Z axis, an axis vertically perpendicular to the Z axis is defined as a Y axis, and an axis horizontally perpendicular to the Z axis is defined as an X axis. The X axis, the Y axis, and the Z axis constitute an orthogonal three-dimensional coordinate system.

The gradient field coil 43 is a coil unit attached to the inside of the static field magnet 41 and formed in a hollow substantially cylindrical shape. The gradient field coil 43 receives a supply of a current from the gradient field power supply 21 to generate a gradient field. More specifically, the gradient field coil 43 has three coils corresponding to the X axis, the Y axis, and the Z axis orthogonal to each other. The three coils form a gradient field in which the magnetic field strength changes along the X axis, the Y axis, and the Z axis, respectively. The gradient fields along the X axis, the Y axis, and the Z axis are combined to form in desired directions a slice selection gradient field Gs, a phase encoding gradient field Gp, and a frequency encoding gradient field Gr that are orthogonal to each other. The slice selection gradient field Gs is used to freely determine an imaging slice. The phase encoding gradient field Gp is used to change a phase of a magnetic resonance signal (hereinafter, referred to as an MR signal) according to a spatial position. The frequency encoding gradient field Gr is used to change a frequency of the MR signal according to the spatial position. In the following explanation, a direction in which the slice selection gradient field Gs is a gradient will be referred to as the Z axis, a direction in which the phase encoding gradient field Gp is a gradient will be referred to as the Y axis, and a direction in which the frequency encoding gradient field Gr is a gradient will be referred to as the X axis.

The gradient field power supply 21 supplies a current to the gradient field coil 43 in accordance with a sequence control signal from the sequence control circuit 29. The gradient field power supply 21 supplies a current to the gradient field coil 43 and causes the gradient field coil 43 to generate a gradient field along each of the X axis, Y axis, and Z axis. The gradient field is superimposed on the static magnetic field formed by the static field magnet 41 and is applied to a subject P.

The transmitter coil 45 is disposed, for example, inside the gradient field coil 43, and receives a supply of a current from the transmitting circuit 23 to generate a high-frequency pulse (hereinafter, referred to as an RF pulse).

The transmitting circuit 23 supplies a current to the transmitter coil 45 in order to apply the RF pulse for exciting a target proton in the subject P to the subject P via the transmitter coil 45. The RF pulse oscillates at a resonance frequency specific to the target proton to excite the target proton. An MR signal is generated from the excited target proton and is detected by the local coil apparatus 100. The transmitter coil 45 is, for example, a whole-body coil (WB coil). The whole-body coil may be used as a transmitter and receiver coil.

The local coil apparatus 100 is a supporter-type coil to be fitted on an imaging region of the subject P. The local coil apparatus 100 is, when fitted on the imaging region of the subject P, brought into close contact with the imaging region of the subject P without any space therebetween. Examples of the imaging region include an elbow, a knee, and an ankle. By the action of the RF pulse, the local coil apparatus 100 receives the MR signal emitted from the target proton that is present inside the subject P. The received MR signal is supplied to the receiving circuit 25 via wire, or wirelessly. The local coil apparatus 100 may be referred to as a receiver coil. The local coil apparatus 100 will be described later in detail.

The receiving circuit 25 receives MR signals respectively output from coil elements 102 shown in FIGS. 2 and 3 to be described later. The receiving circuit 25 receives an MR signal generated from the excited target proton via the local coil apparatus 100. The receiving circuit 25 processes the received MR signal to generate a digital MR signal. The digital MR signal can be expressed in a k-space defined by a spatial frequency. Therefore, hereinafter, a digital MR signal will be referred to as k-space data. The k-space data is a type of raw data used for image reconstruction. The k-space data is supplied to the host computer 50 via wire, or wirelessly.

The transmitter coil 45 and the local coil apparatus 100 described above are merely examples. The local coil apparatus 100 may be a transmitter and receiver coil having a transmitting function of the transmitter coil 45 in addition to a receiving function.

The couch 13 is installed adjacent to the gantry 11. The couch 13 has a table top 131 and a base 133. The subject P is placed on the table top 131. The base 133 slidably supports the table top 131 along each of the X axis, the Y axis, and the Z axis. The couch motor 27 is accommodated in the base 133. The couch motor 27 moves the table top 131 under the control of the sequence control circuit 29. The couch motor 27 may, for example, include any motor such as a servo motor or a stepping motor.

The sequence control circuit 29 includes, as hardware resources, a processor such as a central processing unit (CPU) or a micro processing unit (MPU), and a memory such as a read only memory (ROM) or a random access memory (RAM). The sequence control circuit 29 synchronously controls the gradient field power supply 21, the transmitting circuit 23, and the receiving circuit 25 based on the imaging protocol determined by an imaging protocol setting function 511 of the processing circuit 51, executes magnetic resonance imaging on the subject P in accordance with a pulse sequence corresponding to the imaging protocol, and acquires the k-space data relating to the subject P.

As shown in FIG. 1, the host computer 50 is a computer having processing circuit 51, a memory 52, a display 53, an input interface 54, and a communication interface 55.

The processing circuit 51 includes, as hardware resources, a processor such as a CPU. The processing circuit 51 functions as the core of the magnetic resonance imaging apparatus 1. For example, by executing various programs, the processing circuit 51 realizes the imaging protocol setting function 511, a data obtaining function 512, an image generating function 513, an image processing function 514, and a display control function 515.

With the imaging protocol setting function 511, the processing circuit 51 sets an imaging protocol relating to magnetic resonance imaging with a user's instruction via the input interface 54, or sets it automatically. The imaging protocol is a set of various imaging parameters relating to one magnetic resonance imaging. Various parameters may be applied as the imaging parameters, including types of pulse sequences, types of k-space filling methods, imaging time, repetition time (TR), and echo time (TE), etc., set directly or indirectly to perform magnetic resonance imaging.

With the data obtaining function 512, the processing circuit 51 obtains MR data relating to a processing target such as the subject P. The MR data is a generic term for k-space data, MR image data, and hybrid data. The k-space data may be original k-space data, or may be data obtained by performing appropriate data processing, such as data compression processing, resolution decomposition processing, data interpolation processing, and resolution composite processing, on the original k-space data. The hybrid data is data generated by executing Fourier transform or inverse Fourier transform, etc. along at least one axis of the k-space data.

With the image generating function 513, the processing circuit 51 reconstructs an MR image relating to the subject P based on an MR data obtained from the receiving circuit 25. For example, the processing circuit 51 generates an MR image defined in a real space, by performing Fourier transform on MR data in the k-space or frequency space. An iterative approximation reconstruction method or a reconstruction method using a machine learning model may be performed instead of Fourier transform or may be performed in combination with Fourier transform. The processing circuit 51 that realizes the image generating function 513 is an example of a reconstruction unit.

With the image processing function 514, the processing circuit 51 performs various types of image processing on the MR image. For example, the processing circuit 51 performs image processing such as volume rendering, surface rendering, pixel value projection processing, multi-planer reconstruction (MPR) processing, curved MPR (CPR) processing, and the like.

With the display control function 515, the processing circuit 51 displays various types of information on the display 53. For example, the processing circuit 51 displays an MR image generated by the image generating function 513, an MR image generated by the image processing function 514, and a setting screen of an imaging protocol, and the like, on the display 53.

The memory 52 is a storage apparatus such as a hard disk drive (HDD), a solid state drive (SSD), or an integrated circuit storage apparatus, which stores various types of information. The memory 52 may also be, for example, a drive apparatus which reads and writes various types of information from and to a portable storage medium such as a CD-ROM drive, a DVD drive, a flash memory, etc. For example, the memory 52 stores a trained model, k-space data, an MR image data, a control program, etc.

The display 53 displays various types of information by the display control function 515. For example, the display 53 displays an MR image generated by the image generating function 513, an MR image generated by the image processing function 514, and a setting screen of the imaging protocol, and the like. Examples of the display 53 that can be used as appropriate include a CRT display, a liquid crystal display, an organic EL display, an LED display, a plasma display, or any other display known in the art.

The input interface 54 includes an input apparatus that receives various instructions from a user. Examples of the input apparatus include a keyboard, a mouse, various switches, a touch screen, and a touch pad. The input apparatus is not limited to an apparatus having physical operational components such as a mouse, a keyboard, etc. For example, examples of the input interface 54 also include an electrical signal processing circuit that receives an electrical signal corresponding to an input operation from an external input apparatus provided separately from the magnetic resonance imaging apparatus 1, and outputs the received electrical signal to various circuits.

The communication interface 55 is an interface connecting the magnetic resonance imaging apparatus 1 with a workstation, a picture archiving and communication system (PACS), a hospital information system (HIS), a radiology information system (RIS), and the like via a local area network (LAN) or the like. The communication interface 55 transmits and receives various types of information to and from the connected workstation, PACS, HIS and RIS.

The above configuration is merely an example, and is not a limitation. For example, the sequence control circuit 29 may be embedded in the host computer 50. The sequence control circuit 29 and the processing circuit 51 may also be mounted on the same substrate.

Hereinafter, the configuration of the local coil apparatus 100 will be described. Herein, the configuration of the local coil apparatus 100 that is to be fitted on the knee of the subject P will be described as one example. The local coil apparatus 100 may be configured so as to be fitted on the elbow, the ankle, etc., of the subject P.

Figure 2:
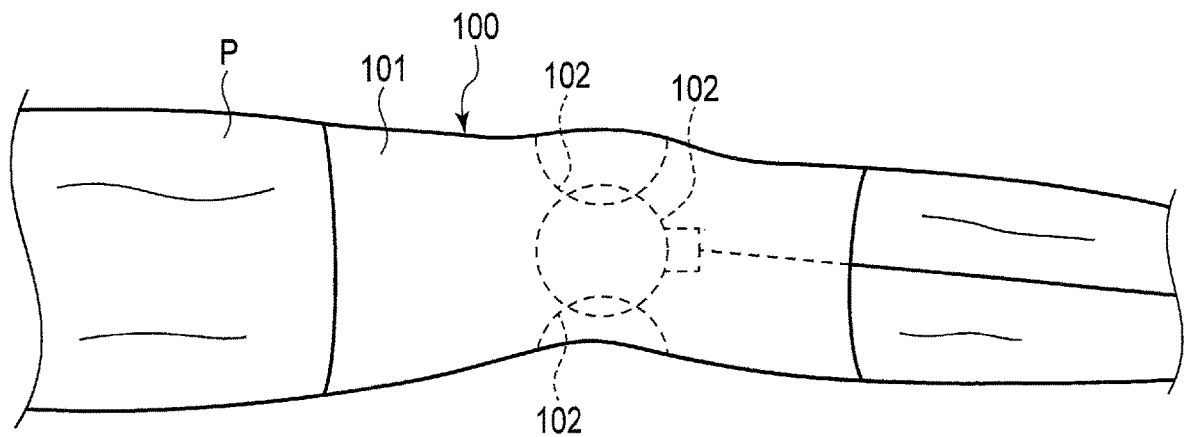
FIG. 2 is a schematic view showing that a local coil apparatus according to the first embodiment is fitted on a subject.
Figure 3:
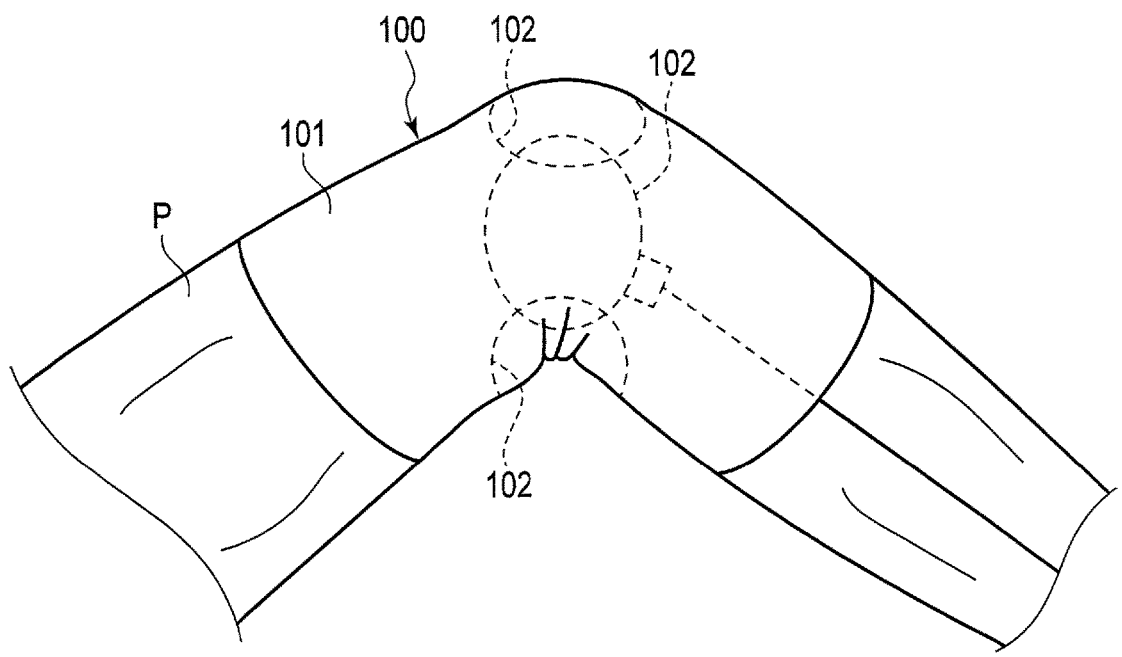
FIG. 3 is a schematic view showing that the local coil apparatus according to the first embodiment is fitted on a subject.
Figure 4:
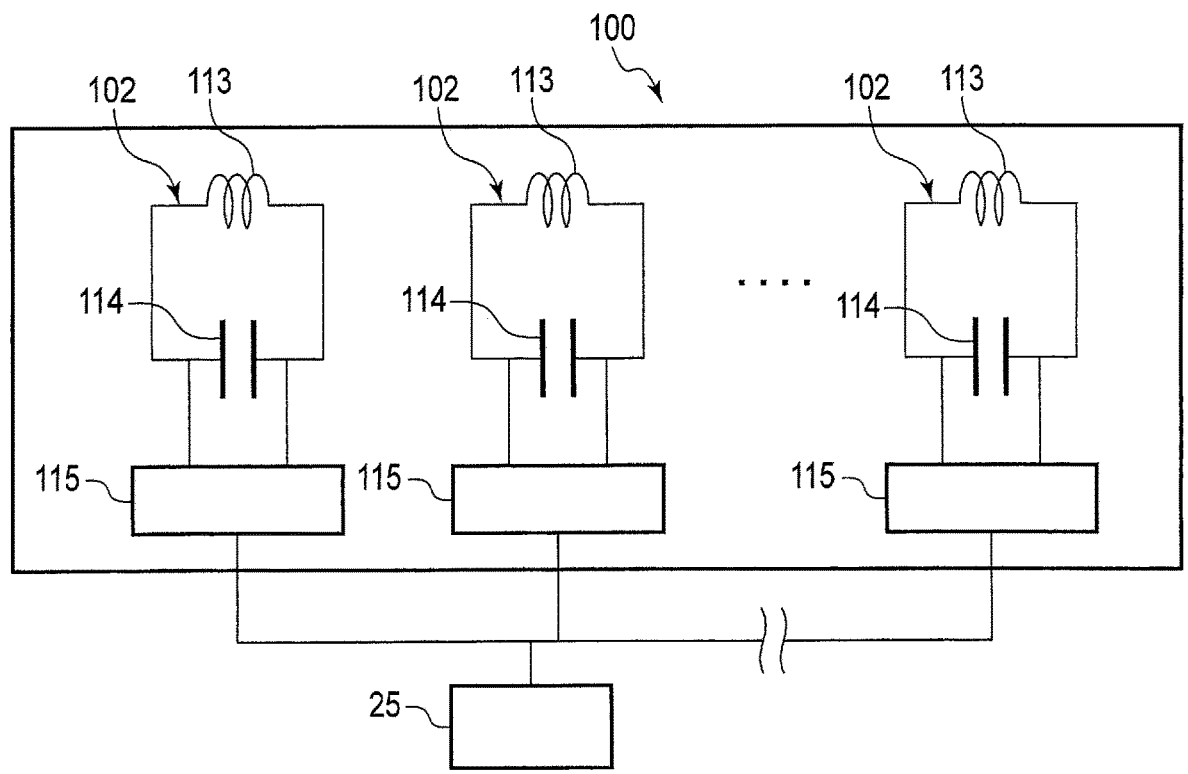
FIG. 4 is a view showing a circuit configuration of the local coil apparatus according to the first embodiment.

FIGS. 2 and 3 each show that the local coil apparatus 100 is fitted on the knee of the subject P. FIG. 4 is a view showing a circuit configuration of the local coil apparatus 100. The local coil apparatus 100 includes a fitting portion 101 and a plurality of reception paths mounted in parallel with each other. The fitting portion 101 is configured by stacking, for example, a plurality of extendable and contractible cloth-made members. The fitting portion 101 is formed into a shape conformable to a shape of an imaging region of the subject P, and is externally brought into tight contact with the knee of the subject P with the local coil apparatus 100 being fitted onto his or her knee. The plurality of reception paths are housed in the fitting portion 101. The fitting portion 101 extends or contracts in response to the subject P stretching out or bending the knee.

Each of the reception paths includes a coil element 102 and an amplifier 115. The coil element 102 is configured to receive an MR signal emitted from a target proton. The amplifier 115 amplifies an output signal of the coil element 102. The coil element 102 detects an MR signal. The coil element 102 is formed into a loop shape (circular shape). The coil element 102 may be formed into a square shape such as a rectangular shape, or into a polygonal shape such as a dodecagonal shape. An MR signal obtained in each reception path is output therefrom via a corresponding amplifier 115, thereby being supplied to the receiving circuit 25 via wire, or wirelessly. The total number of reception paths and the total number of coil elements 102 may be equal or different. Each of the coil elements 102 includes an inductor 113 and a capacitor 114. In each of the coil elements 102, the inductor 113 and the capacitor 114 form a parallel resonance circuit (hereinafter, referred to as an LC circuit). The capacitor 114 may be referred to as a condenser, too.

The local coil apparatus 100 extends or contracts along with the movement in the imaging region of the subject P. For example, when the subject P stretches out the knee as shown in FIG. 2, the coil element 102 enters a state in which a conductor portion 111 to be described later neither extends nor contracts from its natural length (hereinafter, this state will be referred to as a reference state). The reference state may also be referred to as a steady state. In the reference state, respective elements of the coil element 102 are adjusted in such a manner that an electrostatic capacity C, an inductance L, and a resonance frequency of the LC circuit fall within a certain range. On the other hand, when the subject P bends the knee as shown in FIG. 3, the coil element 102 enters a state in which the conductor portion 111 extends from its natural length (hereinafter, this state will be referred to as an extending state). The extending state is larger in inductance L of the inductor 113 than the reference state.

Figure 5:
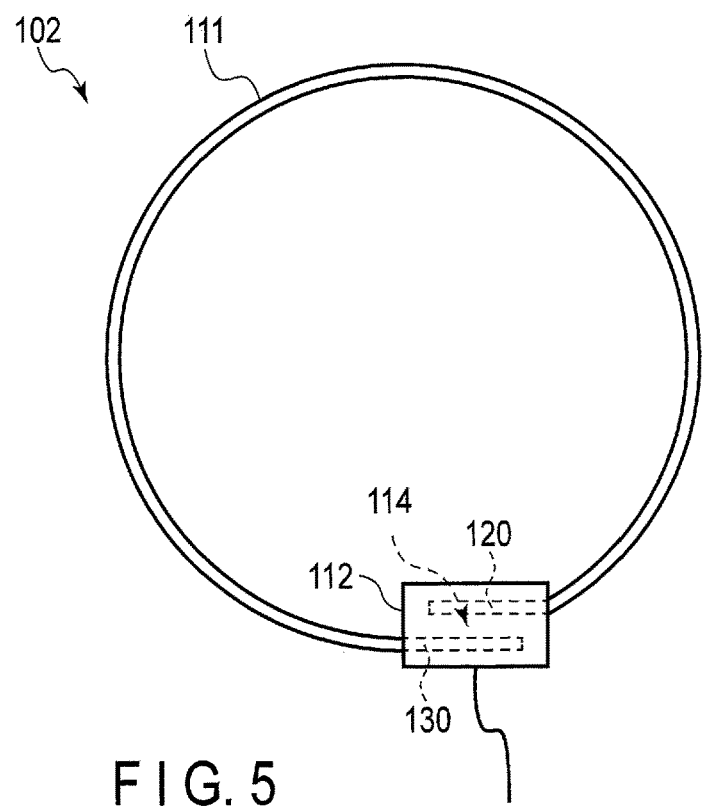
FIG. 5 is a schematic view showing a coil element according to the first embodiment.

FIG. 5 is a schematic view showing a configuration of each coil element 102. As shown in FIG. 5, each of the coil elements 102 includes the conductor portion 111 and a case 112.

The conductor portion 111 is formed of a tube curved into a ring shape. Both ends of the conductor portion 111 are inserted in mutually opposite directions into the case 112.

The conductor portion 111 includes a flexible, extendable and contractible tube. The tube is made of, for example, silicon. The tube is internally filled with a liquid metal. For example, the liquid metal may be but is not limited to gallium indium. The conductor portion 111 functions as the inductor 113 of the LC circuit. The conductor portion 111 is one example of the coil.

The conductor portion 111 extends or contracts in response to extension or contraction of the tube. For example, when the local coil apparatus 100 extends from the reference state, the tube extends, thereby causing the conductor portion 111 to extend. On the other hand, for example, when the local coil apparatus 100 contracts from the extending state, the tube contracts, thereby causing the conductor portion 111 to contract.

In each of the coil elements 102, the inductance L of the inductor 113 changes in response to extension or contraction of the conductor portion 111. For example, when the local coil apparatus 100 extends, the conductor portion 111 extends, thereby enlarging a cross section of a circular loop that the coil element 102 forms. This increases the inductance L of the inductor 113. On the other hand, when the local coil apparatus 100 contracts, the conductor portion 111 contracts, thereby reducing the aforementioned cross section of the circular loop. This decreases the inductance L of the inductor 113.

The case 112 is a housing made of, e.g., metal, resin, or plastic. A first electrode 120, a second electrode 130, and the amplifier 115 are disposed inside the case 112. A circuit configured to execute an AD conversion function, which is a part of the functions of the receiving circuit 25, may be disposed inside the case 112.

The first electrode 120 and the second electrode 130 function as a pair of electrodes of the capacitor 114. The capacitor 114 is connected to the conductor portion 111 and has an electrostatic capacity C which changes due to a physical change of the capacitor 114 in response to extension or contraction of the conductor portion 111. For example, when the local coil apparatus 100 extends to increase the inductance L of the inductor 113, the electrostatic capacity C of the capacitor 114 decreases. On the other hand, when the local coil apparatus 100 contracts to decrease the inductance L of the inductor 113, the electrostatic capacity C of the capacitor 114 increases. Such a change in electrostatic capacity C corresponds to an area of the capacitor 114 varying by a liquid metal flowing from or into the first electrode 120 in response to extension or contraction of the conductor portion 111. The electrostatic capacity C may be referred to as capacitance, too.

The amplifier 115 is connected to each of the conductor portion 111 and the receiving circuit 25. The amplifier 115 amplifies an MR signal received by the conductor portion 111 and outputs the signal to the receiving circuit 25.

Hereinafter, configurations of the first electrode 120 and the second electrode 130 that form the capacitor 114 will be described in detail.

Figure 6:
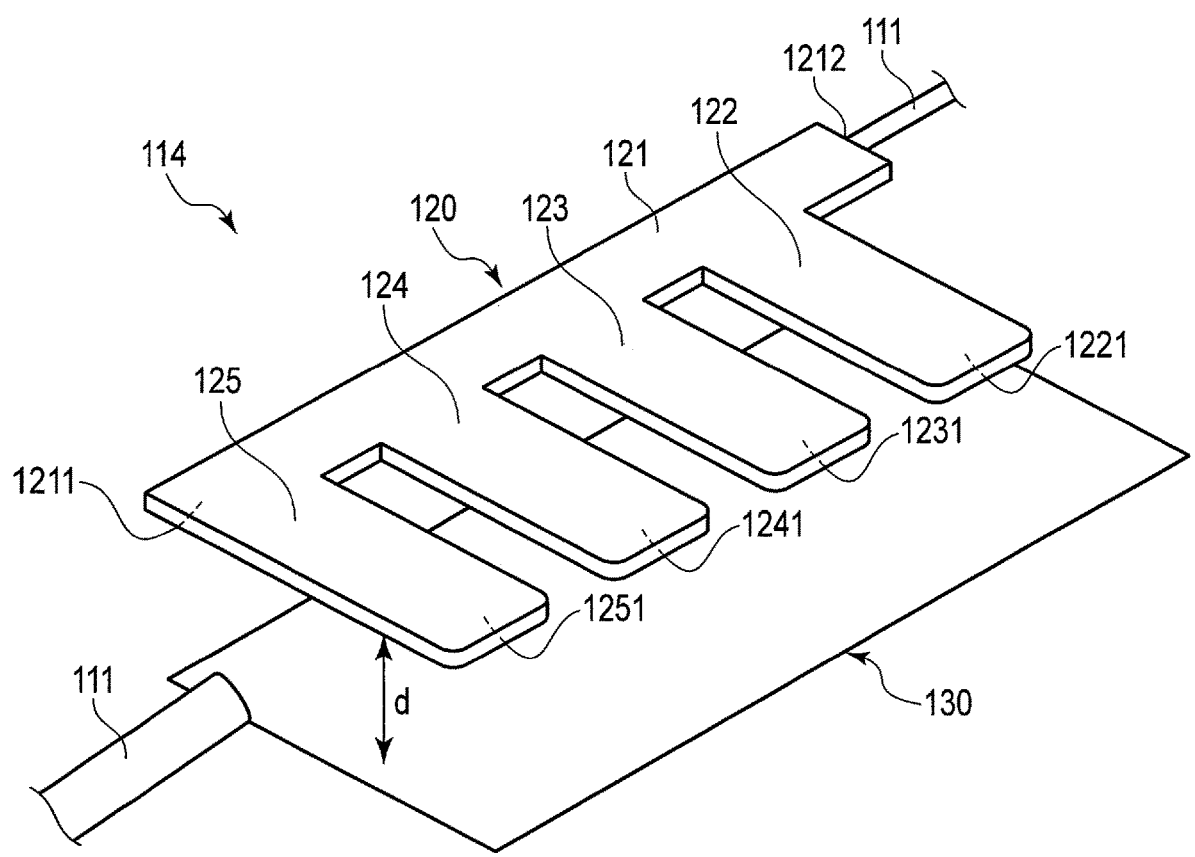
FIG. 6 is a view showing an exemplary configuration of a capacitor according to the first embodiment.
Figure 7:
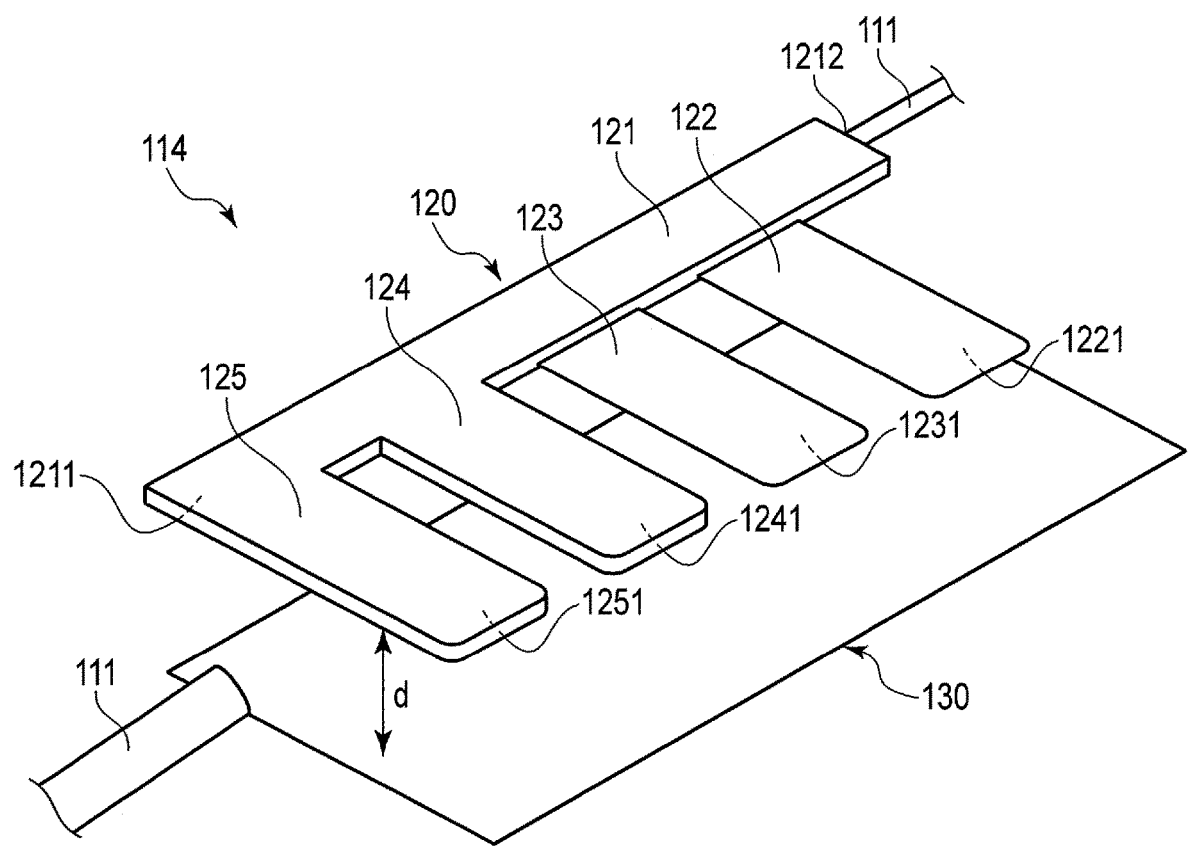
FIG. 7 is a view showing the exemplary configuration of the capacitor according to the first embodiment.

FIGS. 6 and 7 are each a view showing an exemplary configuration of the capacitor 114. FIG. 6 corresponds to a case in which the coil element 102 is in the reference state. FIG. 7 corresponds to a case in which the coil element 102 is in the extending state.

The first electrode 120 and the second electrode 130 constitute the capacitor 114. The first electrode 120 and the second electrode 130 are fixed to the inside of the case 112.

The first electrode 120 is connected to one end of the tube of the conductor portion 111 within the case 112. The second electrode 130 is connected to the other end of the tube of the conductor portion 111 within the case 112. The first electrode 120 and the second electrode 130 at least partially face each other.

The second electrode 130 is, for example, a metal plate having conductivity. The second electrode 130 is fixed substantially in parallel with the first electrode 120.

The first electrode 120 at least partially has conductivity. The first electrode 120 includes a hollow outer sheath connected to the tube of the conductor portion 111. The outer sheath is internally filled with a liquid metal. The outer sheath is made from a material smaller in conductivity than the liquid metal. The outer sheath is, for example, a silicon-made bag-shaped member having an electrical insulating property, and has a flat-plate shape in which a plurality of comb-tooth members are individually expandable and contractible while keeping a comb-shaped outline.

The inside of the outer sheath of the first electrode 120 and the inside of the tube of the conductor portion 111 communicate with each other. Accordingly, the inside of the first electrode 120 communicates with the inside of the conductor portion 111. This allows the liquid metal to flow between the inside of the first electrode 120 and the inside of the conductor portion 111. The conductor portion 111 and the first electrode 120 are configured in such a manner that the liquid metal is prevented from flowing to the exterior. That is, the inside of the first electrode 120 and the inside of the conductor portion 111 are hermetically sealed. For this reason, when the conductor portion 111 extends, a negative pressure is exerted on the inside of the first electrode 120.

The outer sheath of the first electrode 120 is formed in such a manner as to be lower in strength against a negative pressure exerted due to extension of the conductor portion 111 than the tube of the conductor portion 111. For example, the outer sheath of the first electrode 120 is formed to be thinner than that of the tube of the conductor portion 111. For this reason, the outer sheath of the first electrode 120 is more prone to deforming than the tube of the conductor portion 111 in response to a negative pressure being exerted due to extension of the conductor portion 111.

The outer sheath of the first electrode 120 is not limited to the above configuration, and may be appropriately adjusted in terms of strength in accordance with various set values of the capacitor 114. For example, when a facing area between the first electrode 120 and the second electrode 130 is small, the liquid metal inside the first electrode 120 is low. Thus, the electrostatic capacity may change too much in response to the facing area varying by a change in the outer sheath unless the outer sheath is formed in such a manner as to have a strength with which deformation does not easily occur. Therefore, when a facing area is small, the outer sheath of the first electrode 120 may be formed in such a manner as to be higher in strength against a negative pressure exerted due to the extension of the conductor portion 111 than the tube of the conductor portion 111. In this case, the outer sheath of the first electrode 120 is formed to be thicker than the tube of the conductor portion 111, and is hard to deform in response to a negative pressure being exerted due to extension of the conductor portion 111.

With the configuration described above, deformation of the tube of the conductor portion 111 causes a pressure to vary between the inside of the tube and the inside of the outer sheath, so that the liquid metal moves between the inside of the outer sheath and the inside of the tube. For example, when the tube of the conductor portion 111 extends to exert a negative pressure of a predetermined magnitude or more inside the first electrode 120, a part of the first electrode 120 has its outer sheath contracting, and the liquid metal filled into a region in which the outer sheath contracts in the first electrode 120 flows to the inside of the conductor portion 111. On the other hand, when the tube of the conductor portion 111 contracts and a negative pressure exerted inside the first electrode 120 decreases to less than a predetermined magnitude, the liquid metal that has flowed to the inside the conductor portion 111 moves back to the inside of the first electrode 120, and the region in which the outer sheath contracts in the first electrode 120 is restored to its initial state. Specifically, the first electrode 120 physically changes as the conductor portion 111 extends or contracts. In the first electrode 120, the region in which the liquid metal flows out of the outer sheath no longer functions as the electrode of the capacitor 114. Specifically, in the first electrode 120, only the portion in which the liquid metal is filled into the outer sheath functions as the electrode of the capacitor 114.

The first electrode 120 is formed into a comb shape. The first electrode 120 includes a supporting portion 121, a first protruding portion 122, a second protruding portion 123, a third protruding portion 124, and a fourth protruding portion 125. The supporting portion 121 and the first protruding portion 122 to the fourth protruding portion 125 are examples of a plurality of facing portions that face the second electrode 130.

The supporting portion 121 is connected to one end of the tube of the conductor portion 111. The supporting portion 121 includes a facing surface 1211 that faces the second electrode 130. The supporting portion 121 includes a connecting portion 1212 connected to the conductor portion 111. The inside of the supporting portion 121 communicates with the inside of the tube. This allows the liquid metal to flow between the inside of the supporting portion 121 and the inside of the conductor portion 111.

Each of the first protruding portion 122 to the fourth protruding portion 125 protrudes from the supporting portion 121. The first protruding portion 122 includes a facing surface 1221 that faces the second electrode 130. The second protruding portion 123 is positioned further away from the connecting portion 1212 than the first protruding portion 122. The second protruding portion 123 includes a facing surface 1231 that faces the second electrode 130. The third protruding portion 124 is positioned further away from the connecting portion 1212 than the second protruding portion 123. The third protruding portion 124 includes a facing surface 1241 that faces the second electrode 130. The fourth protruding portion 125 is positioned further away from the connecting portion 1212 than the third protruding portion 124. The fourth protruding portion 125 includes a facing surface 1251 that faces the second electrode 130.

Each of the insides of the first protruding portion 122 to the fourth protruding portion 125 communicates with the inside of the supporting portion 121. The liquid metal is allowed to flow between each of the insides of the first protruding portion 122 to the fourth protruding portion 125 and the inside of the supporting portion 121. In each of the first protruding portion 122 to the fourth protruding portion 125, the liquid metal therein flows therefrom to the inside of the supporting portion 121 and also the outer sheath contracts in response to exertion of a negative pressure of a predetermined magnitude or more.

Each of the supporting portion 121 and the first protruding portion 122 to the fourth protruding portion 125 functions as a part of the electrode of the capacitor 114 when the liquid metal is filled into the outer sheath. When functioning as an electrode of the capacitor 114, each of the facing surfaces 1221 to 1251 functions as a part of a surface (hereinafter, referred to as a counter electrode surface) facing the second electrode 130, in which the surface is located in a region of the first electrode 120, in which the first electrode 120 functions as the electrode of the capacitor 114. The electrostatic capacity C of the capacitor 114 changes in response to a change in a total area of a counter electrode surface (hereinafter, referred to as a counter electrode area) S.

The first protruding portion 122 to the fourth protruding portion 125 differ from each other in thickness of the outer sheath. Since the first protruding portion 122 to the fourth protruding portion 125 are different from each other in thickness of the outer sheath, they are also different in strength against a negative pressure caused by extension of the conductor portion 111. In other words, the first protruding portion 122 to the fourth protruding portion 125 are different from each other in magnitude of a negative pressure that is exerted when they no longer function as the electrode after transition from a state in which they are sufficiently filled with the liquid metal to a state in which the liquid metal flows out of them.

Specifically, in terms of the outer sheath, the second protruding portion 123 is formed to be thicker than the first protruding portion 122; the third protruding portion 124 is formed to be thicker than the second protruding portion 123; and the fourth protruding portion 125 is formed to be thicker than the third protruding portion 124. Accordingly, in terms of a strength of the outer sheath, the second protruding portion 123 is higher than the first protruding portion 122; the third protruding portion 124 is higher than the second protruding portion 123; and the fourth protruding portion 125 is higher than the third protruding portion 124.

With the above configuration, as a negative pressure exerted on the inside of the first electrode 120 increases in accordance with extension of the conductor portion 111, among the first protruding portion 122 to the fourth protruding portion 125, the number of portions in which the outer sheath contracts increases. Accordingly, as a region deforms more in the first electrode 120, more liquid metal flows from the inside of the first electrode 120 to the inside of the conductor portion 111. At this time, as the conductor portion 111 extends, the outer sheath contracts in the first electrode 120 in order from a portion having the lowest strength against a negative pressure. Therefore, as the conductor portion 111 extends, the first electrode 120 decreases in terms of a region that functions as the electrode of the capacitor 114 and also decreases in terms of the counter electrode area S of the counter electrode surface of the capacitor 114. As the counter electrode area S decreases, the electrostatic capacity C of the capacitor 114 increases.

The first protruding portion 122 to the fourth protruding portion 125 are formed in such a manner that the outer sheath increases in thickness as it extends further away from the connecting portion 1212. Therefore, as the first protruding portion 122 to the fourth protruding portion 125 extend further away from the connecting portion 1212, they increase in strength against a negative pressure caused by extension of the conductor portion 111.

The supporting portion 121 is larger in thickness of the outer sheath than any of the first protruding portion 122 to the fourth protruding portion 125. For this reason, the supporting portion 121 is higher in strength against a negative pressure caused by extension of the conductor portion 111 than any of the first protruding portion 122 to the fourth protruding portion 125. Therefore, the supporting portion 121 is less prone to deforming in response to a negative pressure internally caused by extension of the conductor portion 111 than any of the first protruding portion 122 to the fourth protruding portion 125.

The supporting portion 121 and the first protruding portion 122 to the fourth protruding portion 125 may be formed in such a manner as to differ from each other in strength of the outer sheath, by, for example, changing a composition of material for the outer sheath, changing the number of layers included in the outer sheath, or changing a physical structure of the outer sheath, forming a reinforcing member that prevents deformation of the outer sheath.

Hereinafter, the operation of the magnetic resonance imaging apparatus 1 will be described.

As shown in FIGS. 2 and 6, when the coil element 102 is in the reference state, a negative pressure caused by extension of the conductor portion 111 is approximately zero inside the first electrode 120. Thus, when the coil element 102 is in the reference state, the outer sheath of the first electrode 120 does not contract, and the liquid metal does not flow from the inside of the first electrode 120 to the inside of the conductor portion 111. Therefore, in the first electrode 120, all of the supporting portion 121 and the first protruding portion 122 to the fourth protruding portion 125 function as the electrode of the capacitor 114, while all of the facing surfaces 1211 and 1221 to 1251 function as the counter electrode surface of the capacitor 114. Assume that the facing surface 1211 has an area S1, the facing surface 1221 has an area S2, the facing surface 1231 has an area S3, the facing surface 1241 has an area S4, and the facing surface 1251 has an area S5. In this case, a counter electrode area Sa with the coil element 102 in the reference state (hereinafter, this area will be referred to as a reference electrode area) is presented as S1+S2+S3+S4+S5. Assume that a distance between the first electrode 120 and the second electrode 130 is d. In this case, an electrostatic capacity Ca with the coil element 102 in the reference state (hereinafter, this electrostatic capacity will be referred to as a reference electrostatic capacity) is equal to $\varepsilon 0 \cdot Sa/d$. Herein, $\varepsilon 0$ denotes a dielectric constant under a vacuum. Dielectric constant $\varepsilon 0$ under a vacuum may also be used as a dielectric constant of air because they are approximately the same.

When the coil element 102 extends from the reference state, a negative pressure caused by extension of the conductor portion 111 is exerted on the inside of the first electrode 120. This causes the first electrode 120 to contract and the liquid metal to flow through the inside of the supporting portion 121 and the inside of the connecting portion 1212 to the inside of the conductor portion 111. Thereafter, as shown in FIGS. 3 and 7, for example, the first protruding portion 122 and the second protruding portion 123 contract, so that the liquid metal filled into them flows through the inside of the supporting portion 121 and the inside of the connecting portion 1212 to the inside of the conductor portion 111. By the liquid metal flowing out of the first protruding portion 122 and the second protruding portion 123, these portions no longer function as the electrode of the capacitor 114. Accordingly, only the supporting portion 121, the third protruding portion 124, and the fourth protruding portion 125 function as the electrode of the capacitor 114, while the facing surfaces 1221, 1241, and 1251 function as the counter electrode surface of the capacitor 114. Thus, a counter electrode area of the capacitor 114 with the coil element 102 in the extending state (hereinafter, this counter electrode area will be referred to as an extending electrode area) Sb (=S1+S4+S5) is smaller than the reference electrode area Sa (=S1+S2+S3+S4+S5). An electrostatic capacity of the capacitor 114 with the coil element 102 in the extending state (hereinafter, this electrostatic capacity will be referred to as an extending electrostatic capacity) Cb (=$\varepsilon 0 \cdot Sb/d$) is smaller than the reference electrostatic capacity Ca (=$\varepsilon 0 \cdot Sa/d$).

When the coil element 102 contracts from the extending state, a pressure varies between the inside of the first electrode 120 and the inside of the conductor portion 111, so that a force for causing the liquid metal filled into the conductor portion 111 to flow to the inside of the first electrode 120 is exerted on the conductor portion 111. For this reason, when the conductor portion 111 contracts, the liquid metal inside the conductor portion 111 flows through the inside of the supporting portion 121 and the inside of the connecting portion 1212 to the inside of the first electrode 120. Accordingly, in the first electrode 120, both a region internally filled with the liquid metal and a region that functions as the electrode of the capacitor 114 increase. As the counter electrode area of the capacitor 114 increases, the electrostatic capacity of the capacitor 114 increases.

As described above, in the coil element 102, when the inductance L increases, the electrostatic capacity C of the capacitor 114 decreases as a negative pressure caused by extension of the conductor portion 111 increases. Furthermore, when the inductance L decreases, the conductor portion 111 contracts whereas the electrostatic capacity C of the capacitor 114 increases.

Hereinafter, advantageous effects of the local coil apparatus 100 and the magnetic resonance imaging apparatus 1 which both include the coil element 102 will be described.

The coil element 102 according to the present embodiment includes the extendable and contractible conductor portion 111 and the capacitor 114 that is connected to the conductor portion 111 and has the electrostatic capacity C which changes due to a physical change in response to extension or contraction of the conductor portion 111. The conductor portion 111 corresponds to the coil. As the conductor portion 111 extends, the inductance L of the conductor portion 111 increases whereas the electrostatic capacity C of the capacitor 114 decreases.

In other words, according to the local coil apparatus 100 and the magnetic resonance imaging apparatus 1 which both include the coil element 102 with the configuration and operation described above, when the coil element 102 and the conductor portion 111 extend, the inductance L of the conductor portion 111 increases whereas the electrostatic capacity C of the capacitor 114 decreases. A relationship between the inductance L, the electrostatic capacity C, and the resonance frequency f is represented by $f=1/\{2\pi(LC)^{(1/2)}\}$ (herein, "^" is a symbol for representing a power). Accordingly, a decrease in electrostatic capacity C acts to cancel a decrease in resonance frequency f caused by an increase of the inductance L. Thus, by the electrostatic capacity C of the capacitor 114 changing in response to extension or contraction of the conductor portion 111, the resonance frequency f can be prevented from varying in response to extension or contraction of the coil element 102. By preventing a variation in resonance frequency f, an MR image can be prevented from decreasing in its quality due to extension or contraction of the coil element 102.

First Modification of First Embodiment

A first modification of the first embodiment will be described below. The present modification is a modification of the configuration of the first embodiment, as will be described below. The present modification differs from the first embodiment in terms of a configuration of the first electrode 120. Descriptions of configurations, operations, and advantageous effects similar to those of the first embodiment will be omitted.

Figure 9:
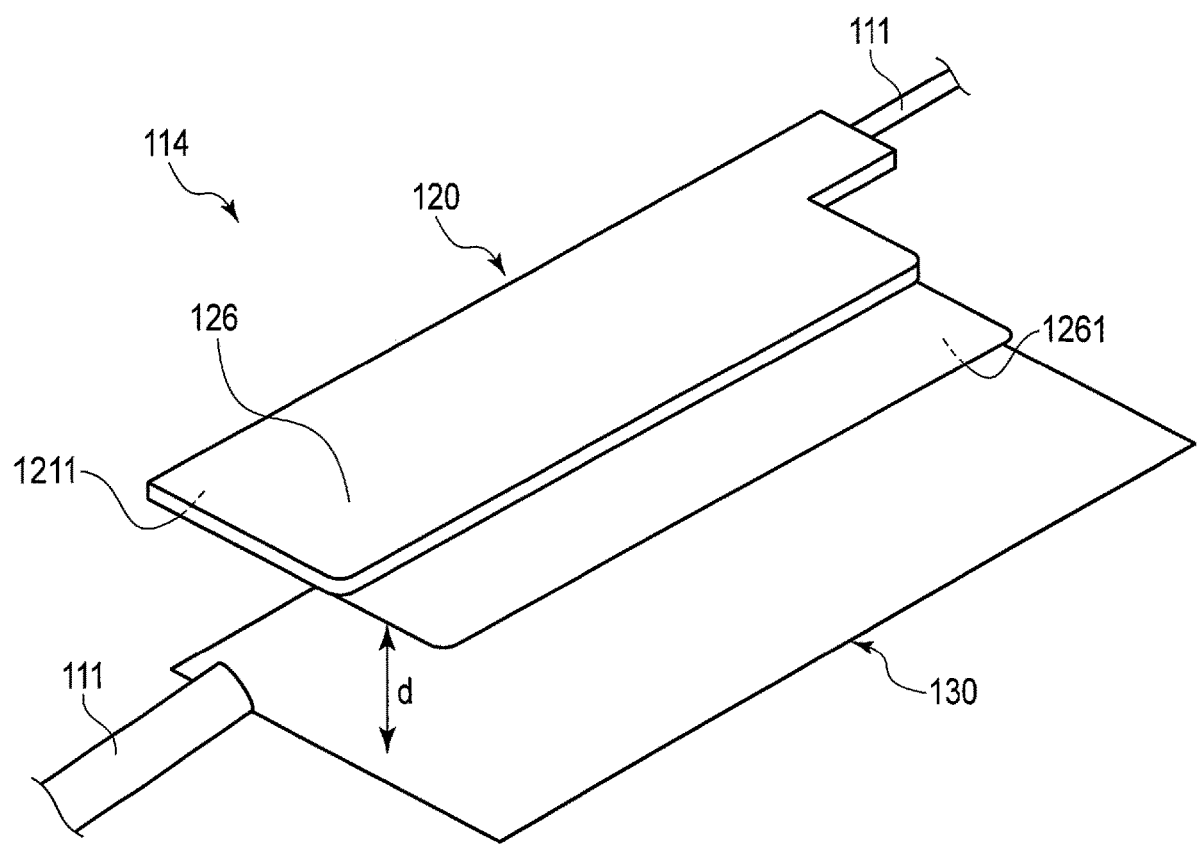
FIG. 9 is a view showing an exemplary configuration of the capacitor according to the first modification of the first embodiment.

FIGS. 8 and 9 are each a view showing an exemplary configuration of the capacitor 114. FIG. 8 corresponds to a case in which the coil element 102 is in the reference state. FIG. 9 corresponds to a case in which the coil element 102 is in the extending state.

The first electrode 120 includes the supporting portion 121 and a protruding portion 126.

The supporting portion 121 has a similar configuration to that of the first embodiment.

The protruding portion 126 protrudes from the supporting portion 121. The protruding portion 126 includes a facing surface 1261 that faces the second electrode 130.

The inside of the protruding portion 126 communicates with the inside of the supporting portion 121. The liquid metal is allowed to flow between the inside of the protruding portion 126 and the inside of the supporting portion 121. In response to a negative pressure of a predetermined magnitude or more being exerted on the inside of the protruding portion 126, the liquid metal flows out from the inside of the protruding portion 126 to the inside of the supporting portion 121 while the outer sheath of the protruding portion 126 contracts.

The protruding portion 126 functions as a part of the electrode of the capacitor 114 when the liquid metal is filled into the outer sheath of the protruding portion 126. Furthermore, when the protruding portion 126 functions as the electrode of the capacitor 114, the facing surface 1261 functions as a part of the counter electrode surface.

The outer sheath of the protruding portion 126 varies in thickness depending on a position facing the second electrode 130. In the protruding portion 126, the outer sheath has a thickness that varies depending on a position and therefore, a strength against a negative pressure caused by extension of the conductor portion 111 varies depending on a position. In other words, the magnitude of a negative pressure which is exerted on the protruding portion 126 when the protruding portion 126 no longer functions as the electrode after transition from a state in which the protruding portion 126 is sufficiently filled with the liquid metal to a state in which the liquid metal flows out of it varies depending on a position. For example, the outer sheath in a position close to the supporting portion 121 is formed to be thicker than the outer sheath in a position away from the supporting portion 121. In this case, the position close to the supporting portion 121 exhibits a higher strength against a negative pressure than the position away from the supporting portion 121.

With the above configuration, as a negative pressure exerted on the inside of the first electrode 120 increases in accordance with extension of the conductor portion 111, the outer sheath contracts in a larger area of the protruding portion 126. Accordingly, as a region deforms more in the first electrode 120, more liquid metal flows from the inside of the first electrode 120 to the inside of the conductor portion 111. At this time, as the conductor portion 111 extends, the outer sheath contracts in the first electrode 120 in order from a portion having the lowest strength against a negative pressure. Therefore, as the conductor portion 111 extends, the first electrode 120 decreases in terms of a region that functions as the electrode of the capacitor 114 and also decreases in terms of the counter electrode area S of the counter electrode surface of the capacitor 114. As the counter electrode area S decreases, the electrostatic capacity C of the capacitor 114 increases.

The protruding portion 126 may be formed in such a manner as to vary in strength of its outer sheath depending on a position by changing a composition, etc. of material used to form the outer sheath of the protruding portion 126.

Hereinafter, the operation of the magnetic resonance imaging apparatus 1 will be described.

As shown in FIGS. 2 and 8, when the coil element 102 is in the reference state, a negative pressure caused by extension of the conductor portion 111 approximates zero inside the first electrode 120. Thus, when the coil element 102 is in the reference state, the outer sheath of the first electrode 120 does not contract, and the liquid metal does not flow from the inside of the first electrode 120 to the inside of the conductor portion ill. Therefore, in the first electrode 120, both of the supporting portion 121 and the protruding portion 126 function as the electrode of the capacitor 114, while both of the facing surfaces 1221 and 1261 function as the counter electrode surface of the capacitor 114. Assuming that the facing surface 1261 has an area S6, the reference electrode area Sa is equal to S1+S6. In this case, the reference electrostatic capacity Ca is equal to ε0·Sa/d.

When the coil element 102 extends from the reference state, a negative pressure caused by extension of the conductor portion 111 is exerted on the inside of the first electrode 120. This causes the first electrode 120 to contract and the liquid metal to flow through the inside of the supporting portion 121 and the inside of the connecting portion 1212 to the inside of the conductor portion 111. Thereafter, as shown in FIGS. 3 and 9, for example, a part of the protruding portion 126 contracts, so that a part of the liquid metal filled into the protruding portion 126 flows through the inside of the supporting portion 121 and the inside of the connecting portion 1212 to the inside of the conductor portion 111. In the protruding portion 126, the region from which the liquid metal flows out no longer functions as the electrode of the capacitor 114. Accordingly, the area of the facing surface 1261 decreases. In the first electrode 120, the supporting portion 121 and only a part of the protruding portion 126 function as the electrode of the capacitor 114, while the facing surface 1221 and only a part of the facing surface 1261 function as the counter electrode surface of the capacitor 114. This makes the extending electrode area Sb smaller than the reference electrode area Sa. Accordingly, the extending electrostatic capacity Cb (=ε0·Sb/d) is smaller than the reference electrostatic capacity Ca (=ε0·Sa/d).

When the coil element 102 contracts from the extending state, a pressure varies between the inside of the first electrode 120 and the inside of the conductor portion 111, so that a force for causing the liquid filled into the conductor portion 111 to flow to the inside of the first electrode 120 is exerted on the conductor portion 111. For this reason, when the conductor portion 111 contracts, the liquid metal inside the conductor portion 111 flows through the inside of the supporting portion 121 and the inside of the connecting portion 1212 to the inside of the first electrode 120. Accordingly, in the first electrode 120, both a region internally filled with the liquid metal and a region that functions as the electrode of the capacitor 114 increase. As the counter electrode area of the capacitor 114 increases, the electrostatic capacity of the capacitor 114 increases.

As in the first embodiment, with the coil element 102 according to the present modification, as the conductor portion 111 extends, the inductance L of the conductor portion 111 increases whereas the electrostatic capacity C of the capacitor 114 decreases. A decrease in electrostatic capacity C acts to cancel a decrease in resonance frequency f caused by an increase in the inductance L. Thus, as in the first embodiment, with the local coil apparatus 100 and the magnetic resonance imaging apparatus 1 which both include the coil element 102 according to the present modification, by the electrostatic capacity C of the capacitor 114 changing in response to extension or contraction of the conductor portion 111, the resonance frequency f can be prevented from varying in response to extension or contraction of the coil element 102.

Second Embodiment

Next, the second embodiment will be described. The present embodiment is a modification of the configuration of the first embodiment, as will be described below. The present embodiment differs from the first embodiment in terms of a configuration of the capacitor 114. Descriptions of configurations, operations, and advantageous effects similar to those of the first embodiment will be omitted.

Figure 10:
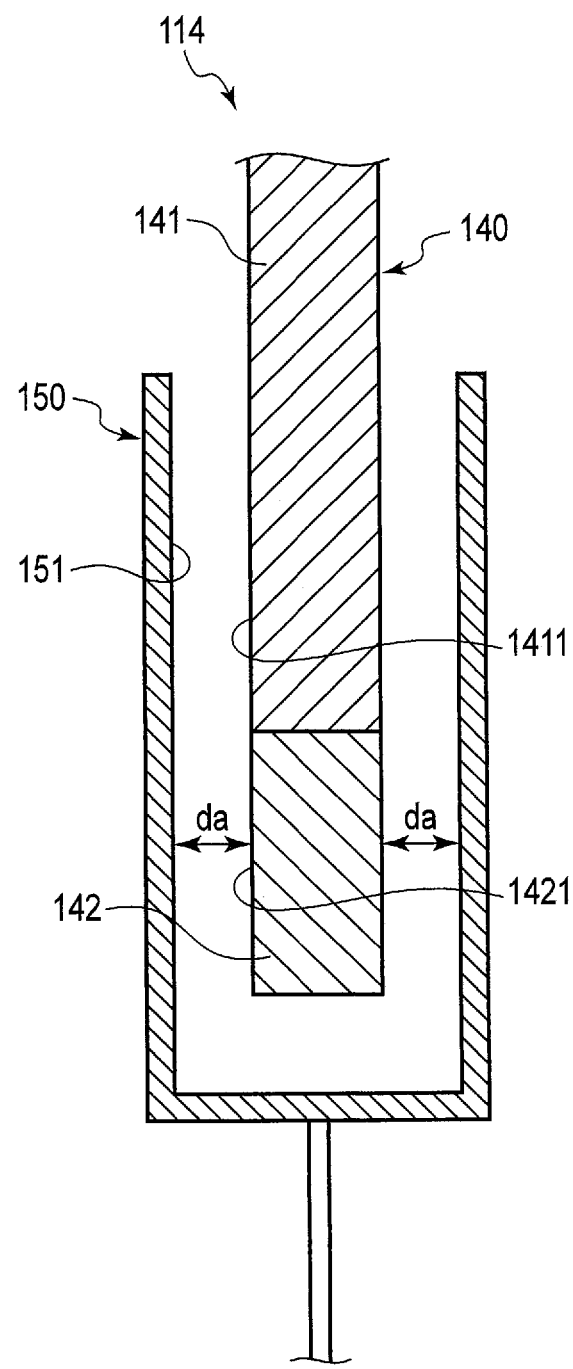
FIG. 10 is a view showing an exemplary configuration of a capacitor according to a second embodiment.
Figure 11:
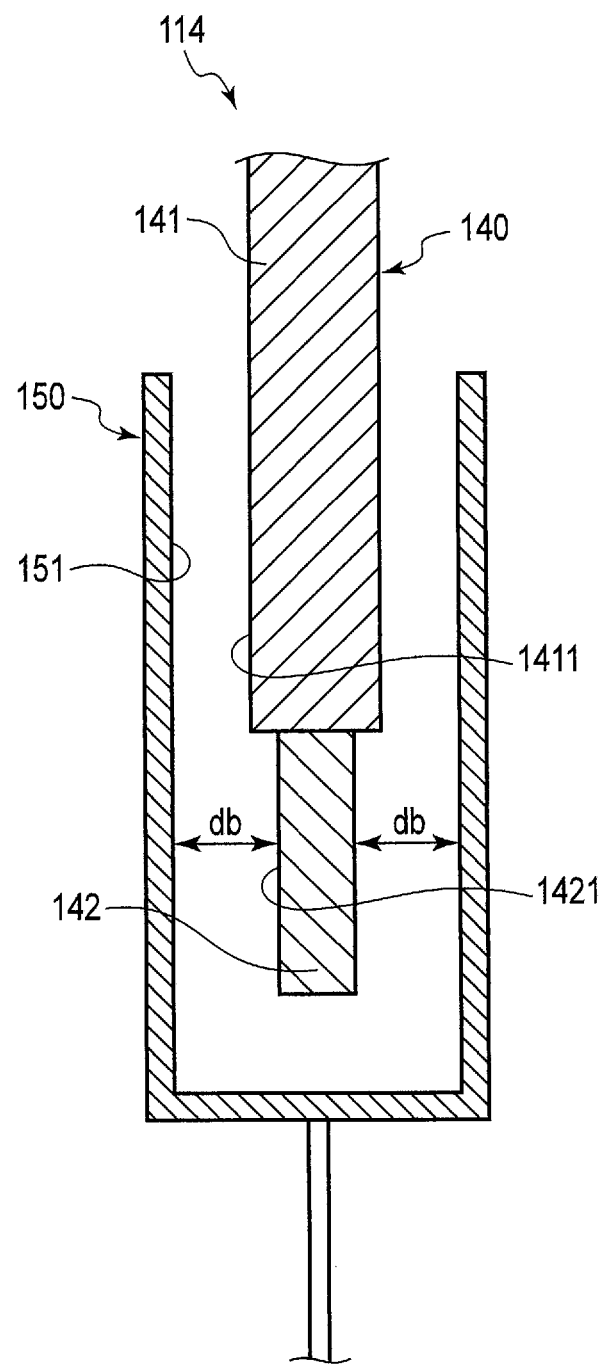
FIG. 11 is a view showing an exemplary configuration of the capacitor according to the second embodiment.

FIGS. 10 and 11 are each a view showing an exemplary configuration of the capacitor 114. FIG. 10 corresponds to a case in which the coil element 102 is in the reference state. FIG. 11 corresponds to a case in which the coil element 102 is in the extending state.

The capacitor 114 includes a first electrode 140 and a second electrode 150.

The first electrode 140 is fixed to the inside of the case 112. The first electrode 140 is connected to one end of the tube of the conductor portion 111 inside the case 112. The first electrode 140 is formed into a cylindrical shape.

The second electrode 150 is fixed to the inside of the case 112. The second electrode 150 is connected to the other end of the tube of the conductor portion 111 inside the case 112. The second electrode 150 is formed into a bottomed hollow cylindrical shape. The second electrode 150 is made of, e.g., metal.

The first electrode 140 has one end connected to the tube of the conductor portion 111, and the other end inserted into the hollow cylindrical shape of the second electrode 150. The outer wall of the first electrode 140 and the inner wall of the second electrode 150 partially face each other. The first electrode 140 and the second electrode 150 function as a pair of electrodes of the capacitor 114.

Shapes of the first electrode 140 and the second electrode 150 are not limited to those described above. The first electrode 140 may be shaped like a prism, a rod, etc.

The first electrode 140 at least partially has conductivity. As in the first embodiment, the first electrode 140 includes the hollow outer sheath internally filled with the liquid metal, and the outer sheath is connected to the tube of the conductor portion 111. Therefore, in the present embodiment also, when the tube of the conductor portion 111 extends to exert a negative pressure of a predetermined magnitude or more inside the first electrode 140, a part of the first electrode 140 has its outer sheath contracting, and the liquid metal filled into a region in which the outer sheath contracts in the first electrode 140 flows to the inside of the conductor portion 111. When a negative pressure exerted inside the first electrode 140 decreases to less than a predetermined magnitude, the liquid metal that has flowed to the inside the conductor portion 111 moves back to the inside of the first electrode 140, and the region in which the outer sheath contracts in the first electrode 140 is restored to its initial state. Specifically, the first electrode 140 physically changes as the conductor portion 111 extends or contracts. In the first electrode 140, the region in which the liquid metal flows out of the outer sheath no longer functions as the electrode of the capacitor 114. Specifically, in the first electrode 140, only a portion in which the outer sheath is internally filled with the liquid metal functions as the electrode of the capacitor 114.

The first electrode 140 includes the supporting portion 141 and the protruding portion 142.

The supporting portion 141 is connected to one end of the tube of the conductor portion 111. The supporting portion 141 includes a facing surface 1411 that faces the second electrode 150. The inside of the supporting portion 141 communicates with the inside of the tube of the conductor portion 111. This allows the liquid metal to flow between the inside of the supporting portion 141 and the inside of the conductor portion 111.

The protruding portion 142 is located closer to the distal side than the supporting portion 141. Therefore, the protruding portion 142 is fixed to a position closer to the bottom surface of the second electrode 150 than the supporting portion 141. The protruding portion 142 includes a facing surface 1421 that faces the second electrode 150.

The inside of the protruding portion 142 communicates with the inside of the supporting portion 141. The liquid metal is allowed to flow between the inside of the protruding portion 142 and the inside of the supporting portion 141. In response to a negative pressure of a predetermined magnitude or more being exerted on the inside of the protruding portion 142, the liquid metal flows out from the inside of the protruding portion 142 to the inside of the supporting portion 141 while the outer sheath of the protruding portion 142 contracts.

The supporting portion 141 and the protruding portion 142 function as a part of the electrode of the capacitor 114 when the liquid metal is filled into their outer sheath. Furthermore, when functioning as the electrode of the capacitor 114, each of the facing surfaces 1411 and 1421 functions as a part of the counter electrode surface.

The supporting portion 141 is larger in terms of thickness of the outer sheath than the protruding portion 142. For this reason, the supporting portion 141 is higher in strength against a negative pressure caused by extension of the conductor portion 111 than the protruding portion 142. Therefore, the supporting portion 141 is less prone to deforming in response to a negative pressure being internally caused by extension of the conductor portion 111 than the protruding portion 142.

Hereinafter, the operation of the magnetic resonance imaging apparatus 1 will be described.

As shown in FIGS. 2 and 10, when the coil element 102 is in the reference state, a negative pressure caused by extension of the conductor portion 111 approximates zero inside the first electrode 140. Thus, when the coil element 102 is in the reference state, the outer sheath of the first electrode 140 does not contract, and the liquid metal does not flow from the inside of the first electrode 140 to the inside of the conductor portion 111. This causes no change in a distance (hereinafter, referred to as a reference interelectrode distance) da between the first electrode 140 and the second electrode 150 in a state in which the coil element 102 is in the reference state. The reference electrostatic capacity Ca is equal to ε0·S/da.

When the coil element 102 extends from the reference state, a negative pressure caused by extension of the conductor portion 111 is exerted on the inside of the first electrode 140. This causes the first electrode 140 to contract and the liquid metal to flow through the inside of the supporting portion 141 to the inside of the conductor portion 111. Thereafter, as shown in FIGS. 3 and 11, for example, a part of the protruding portion 142 contracts, so that a part of the liquid metal filled into the protruding portion 142 flows through the inside of the supporting portion 141 to the inside of the conductor portion 111. By the protruding portion 142 contracting, a distance between the facing surface 1421 and the facing surface 151 increases between the protruding portion 142 and the second electrode 150. That is, a distance (hereinafter, referred to as an extending inter-electrode distance) db between the protruding portion 142 and the second electrode 150 in a state in which the coil element 102 is in the extending state is larger than the reference inter-electrode distance da. Accordingly, the extending electrostatic capacity Cb (=ε0·S/db) is smaller than the reference electrostatic capacity Ca (=ε0·S/da).

When the coil element 102 contracts from the extending state, a pressure changes inside the conductor portion 111 with respect to the first electrode 140, so that a force for causing the liquid filled into the conductor portion 111 to flow to the inside of the first electrode 140 is exerted on the conductor portion 111. For this reason, when the conductor portion 111 contracts, the liquid metal inside the conductor portion 111 flows through the inside of the supporting portion 141 to the inside of the first electrode 140. Accordingly, in the first electrode 140, a region in which the liquid metal is internally filled increases. This decreases a distance between the facing surface 1421 and the facing surface 151 between the protruding portion 142 and the second electrode 150, and increases an electrostatic capacity.

As described above, as the conductor portion 111 extends, by the liquid metal flowing from the inside of the outer sheath of the first electrode 140 to the inside of the tube of the conductor portion 111, the outer sheath of the first electrode 140 contracts and a distance d between the first electrode 140 and the second electrode 150 increases. Accordingly, the inductance L of the conductor portion 111 increases whereas the electrostatic capacity C of the capacitor 114 decreases. A decrease in electrostatic capacity C acts to cancel a decrease in resonance frequency f caused by an increase in the inductance L. Thus, as in the first embodiment, with the local coil apparatus 100 and the magnetic resonance imaging apparatus 1 which both include the coil element 102 according to the present embodiment, by the electrostatic capacity C of the capacitor 114 changing in response to extension or contraction of the conductor portion 111, the resonance frequency f can be prevented from varying in response to extension or contraction of the coil element 102.

First Modification of Second Embodiment

A first modification of the second embodiment will be described below. The present modification is a modification of the configuration of the second embodiment as will be described below. In the present modification, the first electrode 140 is movable with respect to the second electrode 150. Descriptions of configurations, operations, and advantageous effects similar to those of the second embodiment will be omitted.

Figure 13:
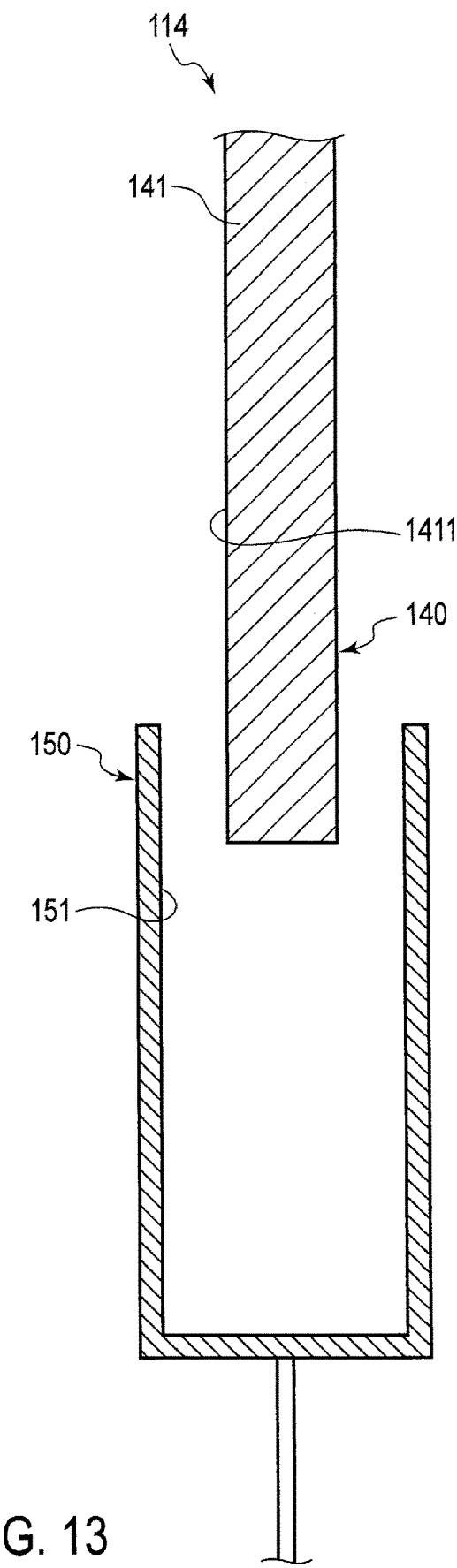
FIG. 13 is a view showing an exemplary configuration of the capacitor according to the first modification of the second embodiment.

FIGS. 12 and 13 are each a view showing an exemplary configuration of the capacitor 114. FIG. 12 corresponds to a case in which the coil element 102 is in the reference state. FIG. 13 corresponds to a case in which the coil element 102 is in the extending state.

The first electrode 140 is attached to the inside of the case 112 in a state in which the first electrode 140 is movable with respect to the second electrode 150 inside the hollow cylindrical shape of the second electrode 150 in the direction in which the second electrode 150 is extended.

The first electrode 140 moves with respect to the second electrode 150 in the direction in which the second electrode 150 is extended, in accordance with extension or contraction of the conductor portion 111. For example, when the coil element 102 extends from the reference state, the conductor portion 111 extends, and a stress for pulling the first electrode 140 in a direction away from the second electrode 150 is exerted on the first electrode 140 by the conductor portion 111. Accordingly, the first electrode 140 moves in the direction away from the second electrode 150 as the conductor portion 111 extends. On the other hand, for example, when the coil element 102 contracts from the extending state, thereby causing the conductor portion 111 to contract, a stress for moving the first electrode 140 in a direction approaching the second electrode 150 is exerted on the first electrode 140 by the conductor portion 111. Accordingly, the first electrode 140 moves in the direction toward the second electrode 150 as the conductor portion 111 contracts.

Considering that the movement of the first electrode 140 changes a positional relationship between the first electrode 140 and the second electrode 150, it is preferable that the inside of the case 112 be provided with a configuration for exerting on the first electrode 140 a force for restoring the positional relationship between the first electrode 140 and the second electrode 150 to the initial state (hereinafter, this configuration will be referred to as a restoring force generating configuration).

Hereinafter, the operation of the magnetic resonance imaging apparatus 1 will be described.

As shown in FIGS. 2 and 12, when the coil element 102 is in the reference state, in the first electrode 140, a stress caused by extension of the conductor portion 111 approximates zero. Therefore, when the coil element 102 is in the reference state, the first electrode 140 does not move from a position (hereinafter, referred to as a reference position) in which the first electrode 140 is situated with the coil element 102 in the reference state.

When the coil element 102 extends from the reference state, inside the first electrode 140, a stress for pulling the first electrode 140 in a direction away from the second electrode 150 is exerted on the first electrode 140 by the conductor portion 111. Thus, the first electrode 140 moves from the reference position in the direction away from the second electrode 150. Then, as shown in, e.g., FIGS. 3 and 13, the first electrode 140 is displaced from the reference position, resulting in a physical deformation in the configuration of the capacitor 114. By the first electrode 140 moving in the direction away from the second electrode 150, a facing area between the first electrode 140 and the second electrode 150 decreases while a distance between the first electrode 140 and the second electrode 150 increases in the entire capacitor 114. This makes the extending electrode area Sb smaller than the reference electrode area Sa, and the extending inter-electrode distance db larger than the reference inter-electrode distance da. As a result, the extending electrostatic capacity Cb (=ε0·Sb/db) becomes smaller than the reference electrostatic capacity Ca (=ε0·Sa/da).

When the coil element 102 contracts from the extending state, inside the first electrode 140, a stress for moving the first electrode 140 in the direction toward the second electrode 150 is exerted on the first electrode 140 by the conductor portion 111, so that the first electrode 140 moves in the direction toward the second electrode 150. Accordingly, a facing area between the first electrode 140 and the second electrode 150 increases while a distance between the first electrode 140 and the second electrode 150 decreases in the entire capacitor 114.

As in the first embodiment, with the coil element 102 according to the present modification, as the conductor portion 111 extends, the inductance L of the conductor portion 111 increases whereas the electrostatic capacity C of the capacitor 114 decreases. A decrease in electrostatic capacity C acts to cancel a decrease in resonance frequency f caused by an increase of the inductance L. Thus, as in the first embodiment, with the local coil apparatus 100 and the magnetic resonance imaging apparatus 1 which both include the coil element 102 according to the present modification, by the electrostatic capacity C of the capacitor 114 changing in response to extension or contraction of the conductor portion 111, the resonance frequency f can be prevented from varying in response to extension or contraction of the coil element 102.

In the present modification, the configuration in which the second electrode 150 is fixed and the first electrode 140 is movable with respect to the second electrode 150 was described as an example. However, the present modification is not limited to such a configuration. For example, the present modification may have a configuration in which the first electrode 140 is fixed to the inside of the case 112 whereas the second electrode 150 is movable with respect to the first electrode 140. In such a case, the second electrode 150 moves in the direction away from the first electrode 140 as the conductor portion 111 extends, and moves in the direction toward the first electrode 140 as the conductor portion 111 contracts. Furthermore, for example, both of the first electrode 140 and the second electrode 150 may be movable inside the case 112. In such a case, both of the first electrode 140 and the second electrode 150 move in move in a direction away from the other electrode as the conductor portion 111 extends, and move in a direction toward the other electrode as the conductor portion 111 contracts. Specifically, the present embodiment may adopt any configuration in which, by the conductor portion 111 extending, at least one of the first electrode 140 and the second electrode 150 both functioning as the pair of electrodes of the capacitor 114 moves to decrease a facing area between the first electrode 140 and the second electrode 150.

Second Modification of Second Embodiment

A second modification of the second embodiment will be described below. The present modification is a modification of the configuration of the second embodiment as will be described below. In the present modification, as the first electrode 140 moves with respect to the second electrode 150, a dielectric material 160 that is input into a space between the first electrode 140 and the second electrode 150 within the capacitor 114 varies in amount. Descriptions of configurations, operations, and advantageous effects similar to those of the first modification of the second embodiment will be omitted.

FIGS. 14 and 15 are each a view showing an exemplary configuration of the capacitor 114. FIG. 14 corresponds to a case in which the coil element 102 is in the reference state. FIG. 15 corresponds to a case in which the coil element 102 is in the extending state.

The dielectric material 160 in liquid form is inserted into the hollow cylindrical shape of the second electrode 150. By being inserted into the space between the first electrode 140 and the second electrode 150, the dielectric material 160 functions as a dielectric for the capacitor 114. In this case, a value of the electrostatic capacity C of the capacitor 114 becomes equal to a total of electrostatic capacity C1 in the first portion in which air is present between the electrodes and electrostatic capacity C2 in the second portion in which a dielectric is present between the electrodes in the case in which the first portion and the second portion are connected in parallel. At this time, dielectric constant ε0 under a vacuum is used as a dielectric constant of the first part, and dielectric constant ε of a dielectric material is used as a dielectric constant of the second part.

The local coil apparatus 100 is further provided with a liquid reservoir. The liquid reservoir stores the dielectric material 160 in liquid form. The liquid reservoir is disposed, for example, outside the capacitor 114 within the case 112. The liquid reservoir is connected to the capacitor 114 with a connecting member such as a tube intervening therebetween. The dielectric material 160 is movable between the inside of the second electrode 150 and the inside of the liquid reservoir through the connecting member.

The dielectric material 160 moves between the inside of the second electrode 150 and the inside of the liquid reservoir in accordance with extension or contraction of the conductor portion 111. For example, as the conductor portion 111 extends, the first electrode 140 moves in the direction away from the second electrode 150, while the dielectric material 160 is supplied from the inside of the liquid reservoir to the inside of the second electrode 150. On the other hand, as the conductor portion 111 contracts, the first electrode 140 moves in the direction toward the second electrode 150, while the dielectric material 160 moves from the inside of the second electrode 150 to the inside of the liquid reservoir. That is, by at least one of the first electrode 140 and the second electrode 150 moving, the dielectric material 160 filled into the space between the first electrode 140 and the second electrode 150 varies in amount.

Hereinafter, the operation of the magnetic resonance imaging apparatus 1 will be described.

As shown in FIGS. 2 and 14, for example, when the coil element 102 is in the reference state, the first electrode 140 does not move from the reference position. The amount of dielectric material 160 that is input into the capacitor 114 does not change from the amount (hereinafter, referred to as a reference input amount) at the time when the coil element 102 is in the reference state.

When the coil element 102 extends from the reference state, the first electrode 140 moves from the reference position in the direction away from the second electrode 150. Inside the second electrode 150, the liquid level of the dielectric material 160 approaches the bottom surface of the hollow cylindrical shape of the second electrode 150. At this time, as the first electrode 140 moves in the direction away from the second electrode 150, the dielectric material 160 is supplied from the inside of the liquid reservoir to the inside of the second electrode 150. As shown in, e.g., FIGS. 3 and 15, by the dielectric material 160 being supplied to the inside of the second electrode 150, the amount (hereinafter, referred to as an extending input amount) of dielectric material 160 that is input into the capacitor 114 when the coil element 102 is in the extending state becomes larger than the reference input amount, and the liquid level of the lowered dielectric material 160 rises again.

When the coil element 102 contracts from the extending state, the first electrode 140 moves in the direction toward the second electrode 150. Inside the second electrode 150, the liquid level of the dielectric material 160 is separated from the bottom surface of the hollow cylindrical shape of the second electrode 150. At this time, as the first electrode 140 moves in the direction toward the second electrode 150, the dielectric material 160 flows from the inside of the second electrode 150 to the inside of the liquid reservoir. This decreases the amount of dielectric material 160 to be input into the capacitor 114.

Hereinafter, advantageous effects of the local coil apparatus 100 and the magnetic resonance imaging apparatus 1 which both include the coil element 102 will be described.

With the coil element 102 according to the present modification, by the first electrode 140 moving as the conductor portion 111 extends, the dielectric material 160 that is input into the space between the first electrode 140 and the second electrode 150 varies in amount. Specifically, as the conductor portion 111 extends, the dielectric material 160 is supplied to the inside of the second electrode 150.

Specifically, according to the local coil apparatus 100 and the magnetic resonance imaging apparatus 1 which both include the coil element 102 with the configuration and operation described above, as the coil element 102 and the conductor portion 111 extend, the amount of the dielectric material 160 supplied to the inside of the second electrode 150 increases. An increase in a supply amount of the dielectric material 160 acts to cancel the lowering of the liquid level of the dielectric material 160 due to separation of the first electrode 140 from the second electrode 150. Since the liquid level of the dielectric material 160 is prevented from lowering, even if a deviation occurs in a positional relationship between the first electrode 140 and the second electrode 150, an unintentional variation can be prevented from occurring in the electrostatic capacity C of the capacitor 114 by filling a moderate amount of dielectric material 160 in the space between the first electrode 140 and the second electrode 150. By preventing an unintentional variation from occurring in the electrostatic capacity C of the capacitor 114, a variation in the resonance frequency f can also be prevented.

Third Embodiment

The third embodiment will be described. The present embodiment is a modification of the configuration of the first embodiment as will be described below. In the present embodiment, each of the coil elements 102 is provided with an LC circuit having a plurality of inductors and a plurality of capacitors. Descriptions of configurations, operations, and advantageous effects similar to those of the first embodiment will be omitted.

Figure 16:
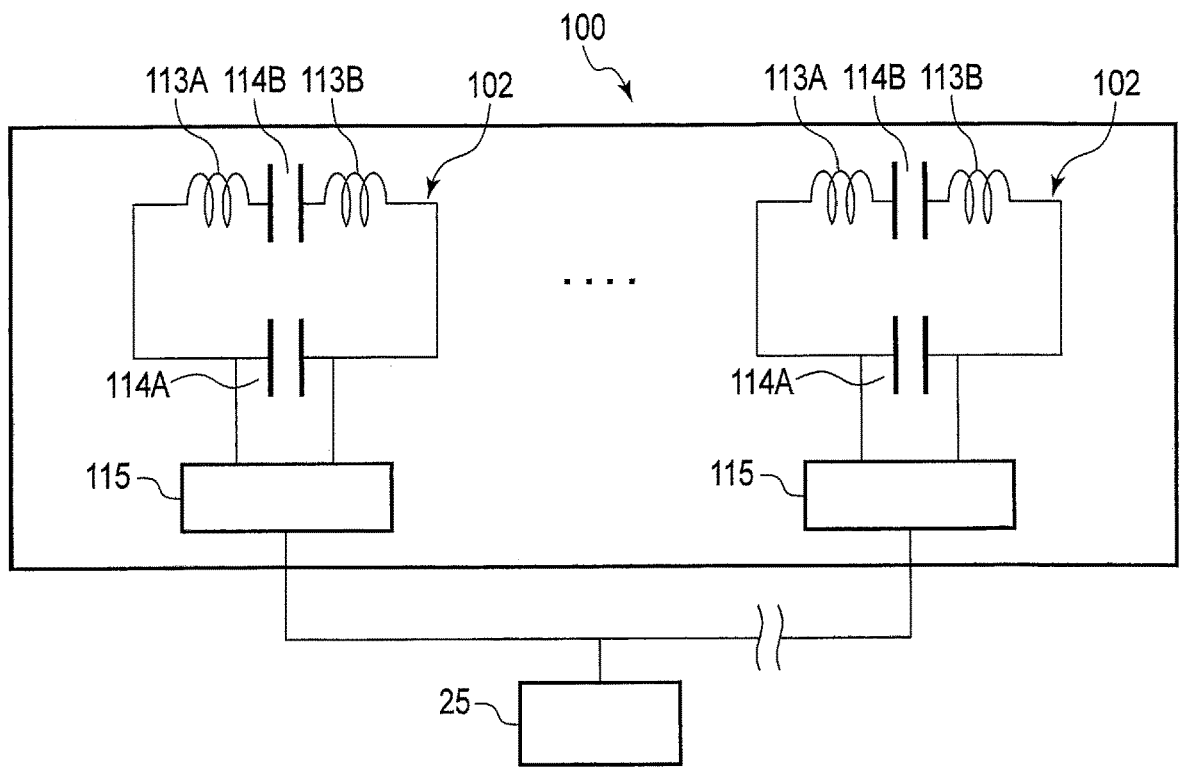
FIG. 16 is a view showing a circuit configuration of a local coil apparatus according to a third embodiment.

FIG. 16 is a view showing a circuit configuration of the local coil apparatus 100. Each of the coil elements 102 includes a first inductor 113A, a second inductor 113B, a first capacitor 114A, and a second capacitor 114B.

Figure 17:
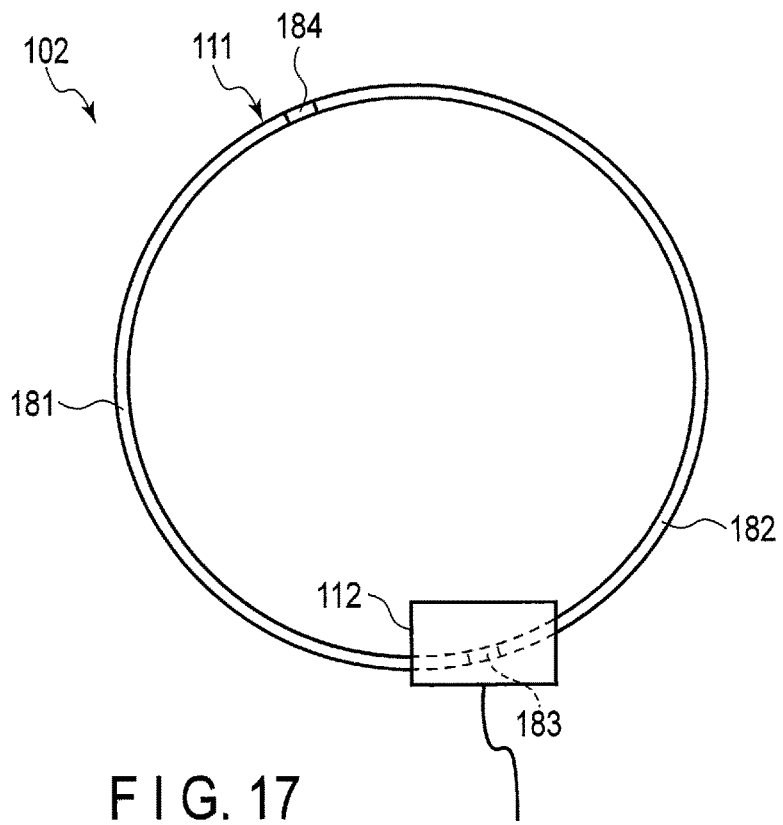
FIG. 17 is a schematic view showing a configuration of a coil element according to the third embodiment.

FIG. 17 is a schematic view of each coil element 102.

The conductor portion 111 is formed in such a manner that a flexible tube is curved in a ring shape. A part of the conductor portion 111 is inserted into the case 112. The conductor portion 111 is continuous inside the case 112.

The conductor portion 111 is flexible and includes an extendable and contractible tube. The tube is internally filled with a liquid metal. A description for the tube and the liquid metal of the conductor portion 111 is omitted because they are similar to those in the first embodiment, etc.

The conductor portion 111 includes a first conductor portion 181, a second conductor portion 182, a first gap portion 183, and a second gap portion 184. The first conductor portion 181 and the second conductor portion 182 contain the liquid metal in the tube.

Each of the first gap portion 183 and the second gap portion 184 is provided between the first conductor portion 181 and the second conductor portion 182. In the annular shape that the conductor portion 111 forms, the first gap portion 183 is provided in, e.g., a 180-degree opposite position to the second gap portion 184. In the first gap portion 183 and the second gap portion 184, the tube is internally filled with air. Air is one example of a fluid different from the liquid metal.

The first conductor portion 181 functions as the first inductor 113A. The second conductor portion 182 functions as the second inductor 113B.

The first conductor portion 181, the second conductor portion 182, and the first gap portion 183 form the first capacitor 114A. The first conductor portion 181 and the second conductor portion 182 function as a pair of electrodes of the first capacitor 114A. The first gap portion 183 functions as a gap between the paired electrodes in the first capacitor 114A.

Similarly, the first conductor portion 181, the second conductor portion 182, and the second gap portion 184 form the second capacitor 114B. The first conductor portion 181 and the second conductor portion 182 function as the pair of electrodes of the second capacitor 114B. The second gap portion 184 functions as a gap between the paired electrodes in the second capacitor 114B.

Figure 18:
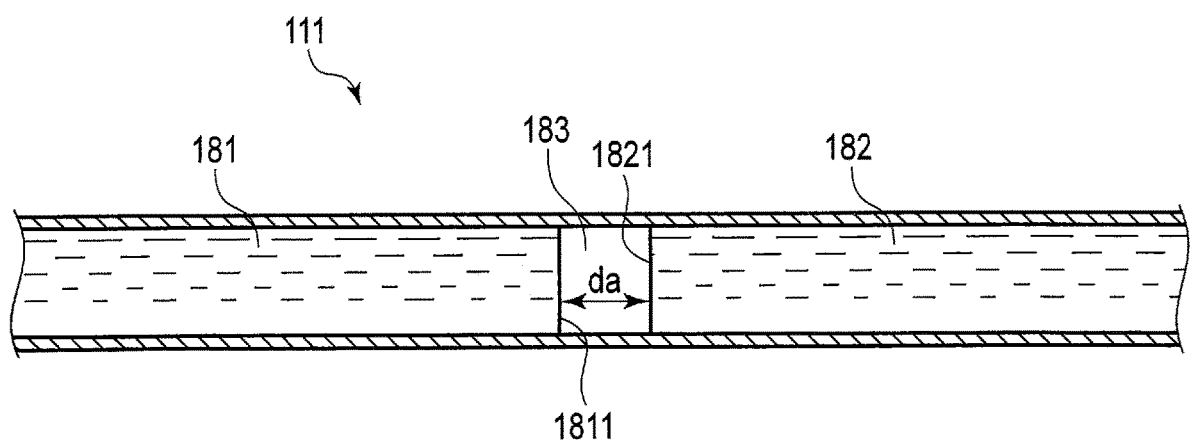
FIG. 18 is a view showing an exemplary configuration of a capacitor according to the third embodiment.
Figure 19:
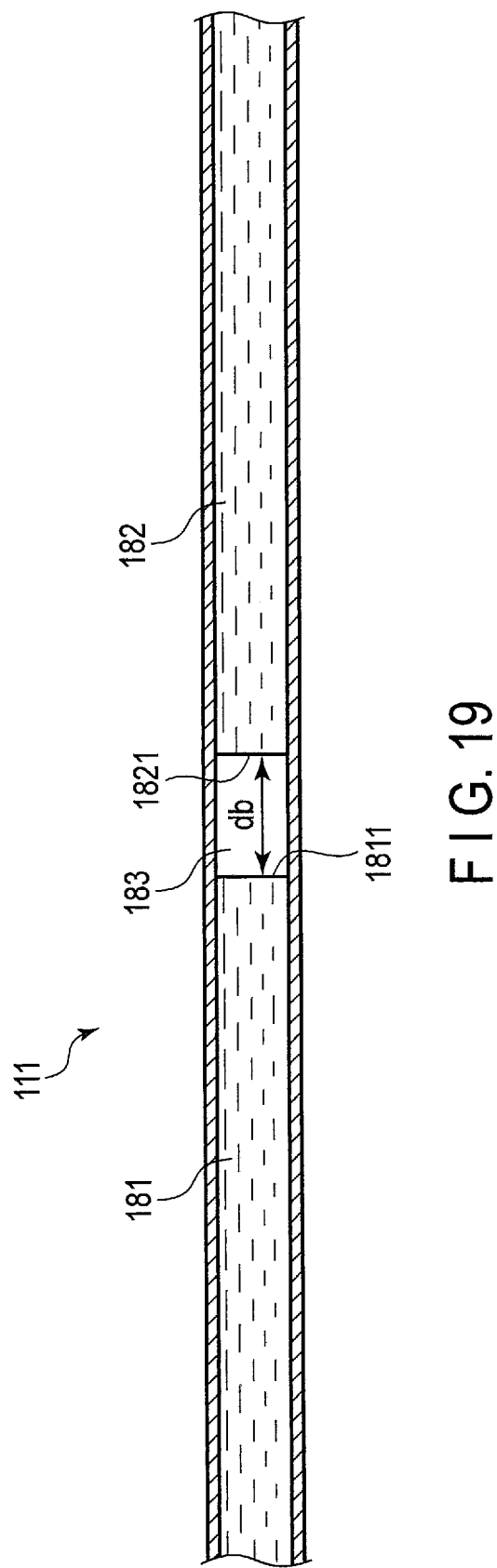
FIG. 19 is a view showing the exemplary configuration of the capacitor according to the third embodiment.

FIGS. 18 and 19 each show an exemplary configuration of the coil element 102. FIG. 18 corresponds to a case in which the coil element 102 is in the reference state. FIG. 19 corresponds to a case in which the coil element 102 is in the extending state. FIGS. 18 and 19 are each an enlarged view of the vicinity of the first gap portion 183 in the coil element 102.

The first conductor portion 181 includes a boundary surface 1811 between the first gap portion 183 and the first conductor portion 181. The boundary surface 1811 is a boundary between the liquid metal inside the first conductor portion 181 and air inside the first gap portion 183. The second conductor portion 182 includes a boundary surface 1821 as a boundary between the first gap portion 183 and the second conductor portion 182. The boundary surface 1821 is a boundary between the liquid metal inside the second conductor portion 182 and air inside the first gap portion 183. The boundary surface 1811 and the boundary surface 1821 function as a pair of counter electrode surfaces in the first capacitor 114A. An area of the boundary surface 1811 or an area of the boundary surface 1821 corresponds to the counter electrode area S in the first capacitor 114A.

Hereinafter, the operation of the magnetic resonance imaging apparatus 1 will be described.

As shown in FIGS. 2 and 18, when the coil element 102 is in the reference state, a distance between the boundary surface 1811 and the boundary surface 1821 does not change from distance da (hereinafter, referred to as a reference inter-electrode distance) between the boundary surface 1811 and the boundary surface 1821 with the coil element 102 in the reference state. The reference electrostatic capacity Ca is equal to $\varepsilon 0 \cdot Sa/da$.

By the conductor portion 111 extending, an internal pressure for causing the conductor portion 111 to contract is exerted on the conductor portion 111. Since the liquid metal is less prone to deforming than air, the first gap portion 183 deforms more than the first conductor portion 181 and the second conductor portion 182. As the conductor portion 111 extends, a distance between the boundary surface 1811 and the boundary surface 1821 increases, and both an area of the boundary surface 1811 and an area of the boundary surface 1821 decrease. As shown in, e.g., FIGS. 3 and 19, in the first capacitor 114A, the extending inter-electrode distance db is larger than the reference inter-electrode distance da whereas the extending electrode area Sb is smaller than the reference electrode area Sa. As a result, in the first capacitor 114A, the extending electrostatic capacity Cb (=ε0·Sb/db) becomes smaller than the reference electrostatic capacity Ca (=ε0·Sa/da).

As the conductor portion 111 contracts from the extending state, a distance between the boundary surface 1811 and the boundary surface 1821 decreases, and both an area of the boundary surface 1811 and an area of the boundary surface 1821 increase. This decreases the inter-electrode distance and increases the electrode area in the first capacitor 114A. Accordingly, the first capacitor 114A is increased in electrostatic capacity.

As in the first capacitor 114A, in the second capacitor 114B, the extending electrostatic capacity Cb becomes smaller than the reference electrostatic capacity Ca.

As in the first embodiment, with the coil element 102 according to the present embodiment, as the conductor portion 111 extends, the inductance L of the LC circuit increases whereas the electrostatic capacity C decreases. A decrease in electrostatic capacity C acts to cancel a decrease in resonance frequency f caused by an increase in the inductance L. Thus, as in the first embodiment, with the local coil apparatus 100 and the magnetic resonance imaging apparatus 1 which both include the coil element 102 according to the present modification, by the electrostatic capacity C of the capacitor 114 changing in response to extension or contraction of the conductor portion 111, the resonance frequency f can be prevented from varying in response to extension or contraction of the coil element 102.

The first gap portion 183 and the second gap portion 184 may be filled with a dielectric material in liquid form, instead of air. Examples of the dielectric material include silicon. In this case, each of the expressions for the reference electrostatic capacity Ca and the extending electrostatic capacity Cb uses dielectric constant ε of a dielectric material, instead of dielectric constant ε0 under a vacuum.

Furthermore, in order to secure the stability of a shape of a gap portion, for example, a divider may be provided in a boundary between a conductor portion and a gap portion.

According to at least one of the embodiments described above, in a receiver coil including an extendable and contractible coil element, the resonance frequency can be prevented from varying in response to extension or contraction of the coil element.

The term "processor" used in the above description indicates, for example, a circuit such as a CPU, a GPU, or an Application Specific Integrated Circuit (ASIC), and a programmable logic device (for example, a Simple Programmable Logic Device (SPLD), a Complex Programmable Logic Device (CPLD), and a Field Programmable Gate Array (FPGA)). A processor realizes its functions by reading and executing a program stored in a storage circuit. Instead of storing a program in a storage circuit, a program may be directly integrated into a circuit of a processor. In this case, a processor reads and executes a program integrated into a circuit, thereby realizing its functions. The function corresponding to the program may be realized by a combination of logic circuits, not by executing the program. Each processor of the present embodiment is not limited to a configuration as a single circuit; a plurality of independent circuits may be combined into one processor to realize the function of the processor. In addition, a plurality of structural elements in FIG. 1 may be integrated in one processor to realize the function.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A coil element comprising:
    an extendable and contractible coil internally containing a liquid metal; and
    a capacitor that is connected to the coil and has an electrostatic capacity which changes due to a physical change in response to extension or contraction of the coil.

2. The coil element according to claim 1, wherein the coil functions as an inductor of the coil element.

3. The coil element according to claim 1, wherein:
    the capacitor has a pair of electrodes at least partially facing each other; and
    at least one of the pair of electrodes physically changes in response to extension or contraction of the coil.

4. The coil element according to claim 3, wherein:
    the coil includes an extendable and contractible hollow tube and extends or contracts in response to extension or contraction of the tube;
    the tube includes:
        a first conductor portion internally filled with the liquid metal;
        a second conductor portion internally filled with the liquid metal; and
        a gap portion that is formed between the first conductor portion and the second conductor portion, and is filled with a fluid different from the liquid metal; and
    the first conductor portion and the second conductor portion function as the pair of electrodes.

5. The coil element according to claim 4, wherein as the tube extends, an area of a boundary surface between the first conductor portion and the gap portion decreases in the first conductor portion, an area of a boundary surface between the second conductor portion and the gap portion decreases in the second conductor portion, and a distance between the first conductor portion and the second conductor portion increases.

6. The coil element according to claim 1, wherein by an electrostatic capacity of the capacitor changing in response to extension or contraction of the coil, a resonance frequency is prevented from varying due to extension or contraction of the coil.

7. The coil element according to claim 1, wherein:
    the coil has an extendable and contractible tube internally filled with the liquid metal, and extends or contracts in response to extension or contraction of the tube;
    the capacitor includes a first electrode and a second electrode facing the first electrode; and
    the first electrode is connected to the tube and includes a hollow outer sheath internally filled with the liquid metal.

8. The coil element according to claim 7, wherein an inside of the tube and an inside of the outer sheath communicate with each other.

9. The coil element according to claim 8, wherein deformation of the tube causes a pressure to vary between the inside of the tube and the inside of the outer sheath, so that the liquid metal moves between the inside of the outer sheath and the inside of the tube.

10. The coil element according to claim 9, wherein the outer sheath is smaller in conductivity than the liquid metal.

11. The coil element according to claim 9, wherein the first electrode includes a plurality of facing portions that face the second electrode.

12. The coil element according to claim 11, wherein the plurality of facing portions are different in strength against a negative pressure.

13. The coil element according to claim 12, wherein as the coil extends, facing portions that deform increase in number.

14. The coil element according to claim 9, wherein:
the outer sheath has a strength that varies depending on a position facing the second electrode; and
as the coil extends, an area that deforms increases in the first electrode.

15. The coil element according to claim 9, wherein:
the second electrode has a hollow cylindrical shape; and
the first electrode is inserted into the hollow cylindrical shape of the second electrode, and includes a facing surface that faces an inner wall of the second electrode.

16. The coil element according to claim 15, wherein by the liquid metal flowing from the inside of the outer sheath to the inside of the tube, the outer sheath contracts, and a distance between the first electrode and the second electrode increases.

17. The coil element according to claim 15, wherein by the coil extending, at least one of the first electrode and the second electrode moves, and a facing area between the first electrode and the second electrode decreases.

18. The coil element according to claim 17, wherein by at least one of the first electrode and the second electrode moving, a dielectric material filled into a space between the first electrode and the second electrode varies in amount.

19. A local coil apparatus comprising:
the coil element according to claim 1; and
a receiving circuit configured to receive an MR signal output from the coil element.

20. A magnetic resonance imaging apparatus comprising:
the local coil apparatus according to claim 19; and
a reconstruction unit configured to reconstruct an image based on an MR signal obtained from the receiving circuit.

21. The coil element according to claim 1, wherein:
the coil includes a conductor portion internally filled with the liquid metal; and
the liquid metal extends or contracts in response to extension or contraction of the conductor portion.

* * * * *